(12) United States Patent
Lin et al.

(10) Patent No.: US 12,442,742 B2
(45) Date of Patent: Oct. 14, 2025

(54) TEST STRUCTURES TO DETERMINE INTEGRATED CIRCUIT BONDING ENERGIES AND METHODS OF MAKING AND USING THE SAME

(71) Applicant: Taiwan Semiconductor Manufacturing Company Limited, Hsinchu (TW)

(72) Inventors: Yu-Sheng Lin, Zhubei (TW); Jyun-Lin Wu, Hsinchu (TW); Yao-Chun Chuang, Hsinchu (TW); Chin-Fu Kao, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 351 days.

(21) Appl. No.: 18/303,647

(22) Filed: Apr. 20, 2023

(65) Prior Publication Data
US 2024/0094104 A1 Mar. 21, 2024

Related U.S. Application Data

(60) Provisional application No. 63/406,755, filed on Sep. 15, 2022.

(51) Int. Cl.
*G01N 3/20* (2006.01)
*G01N 19/04* (2006.01)

(52) U.S. Cl.
CPC ............... *G01N 3/20* (2013.01); *G01N 19/04* (2013.01); *G01N 2203/0064* (2013.01)

(58) Field of Classification Search
CPC ... G01N 3/20; G01N 2203/0064; G01N 19/04
See application file for complete search history.

(56) References Cited

U.S. PATENT DOCUMENTS

| 6,790,707 B1 * | 9/2004 | Cui ......................... H01L 22/34 438/114 |
| 2003/0082846 A1 * | 5/2003 | Yoneda ............. H01L 23/49822 257/E23.101 |

(Continued)

FOREIGN PATENT DOCUMENTS

WO WO-2008066741 A1 * 6/2008 ................ C09J 5/06

*Primary Examiner* — Jonathan M Dunlap
(74) *Attorney, Agent, or Firm* — The Marbury Law Group, PLLC

(57) ABSTRACT

An embodiment interfacial bonding test structure may include a first substrate having a first planar surface, a second substrate having a second planar surface that is parallel to the first planar surface, a first semiconductor die, and a second semiconductor die, each semiconductor die bonded between the first substrate and the second substrate thereby forming a sandwich structure. The first semiconductor die and the second semiconductor die may be bonded to the first surface with a first adhesive and may be bonded to the second surface with a second adhesive. The first semiconductor die and the second semiconductor die may be displaced from one another by a first separation along a direction parallel to the first planar surface and the second planar surface. The second substrate may include a notch having an area that overlaps with an area of the first separation in a plan view.

20 Claims, 17 Drawing Sheets

(56) References Cited

U.S. PATENT DOCUMENTS

2010/0206062 A1\* 8/2010 Yoon ................ G01N 19/04
                                                73/150 A
2023/0268318 A1\* 8/2023 Chen ................ G01M 7/08
                                                257/774

\* cited by examiner

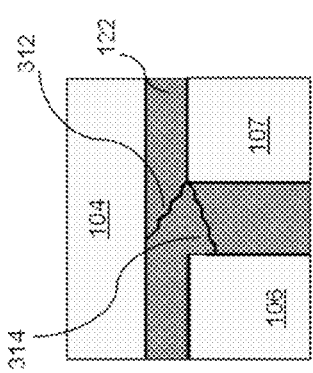
FIG. 3D
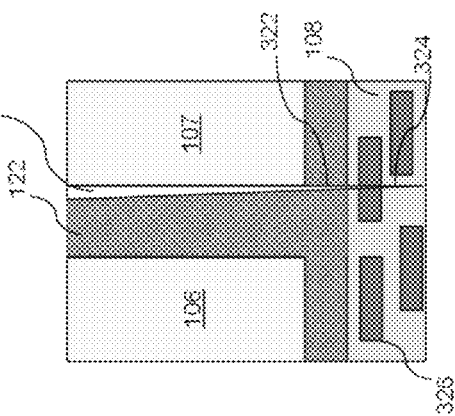
FIG. 3F
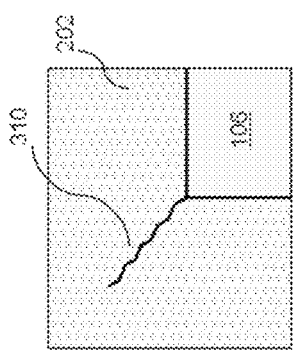
FIG. 3C
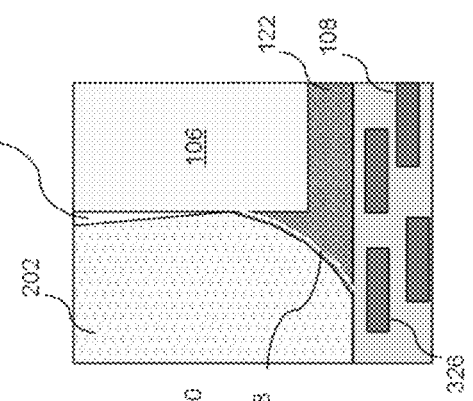
FIG. 3E
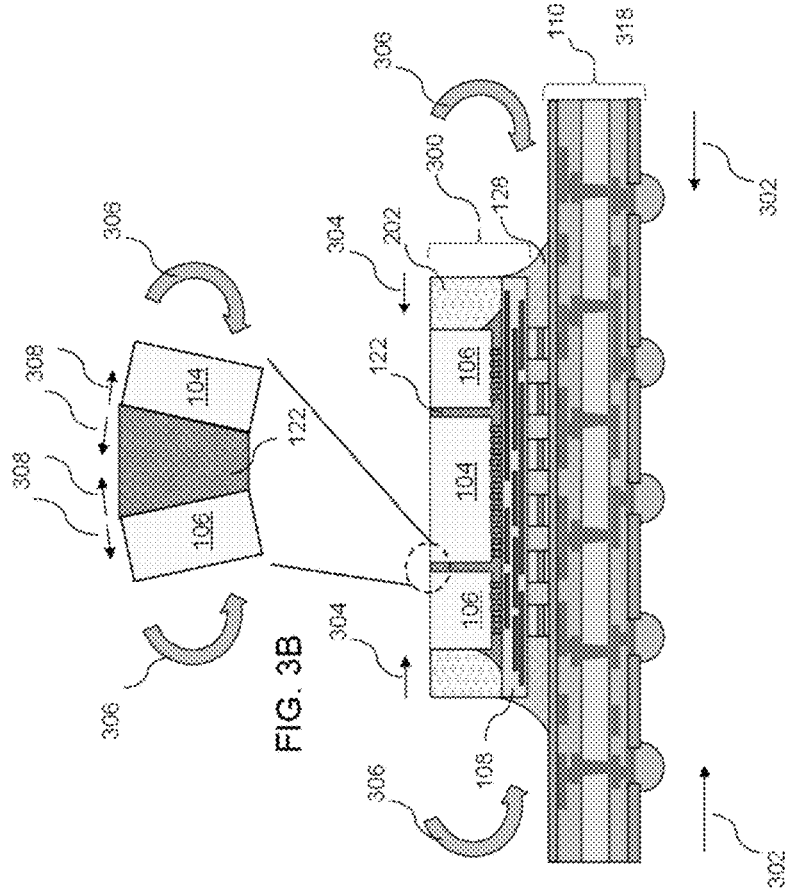
FIG. 3A
FIG. 3B

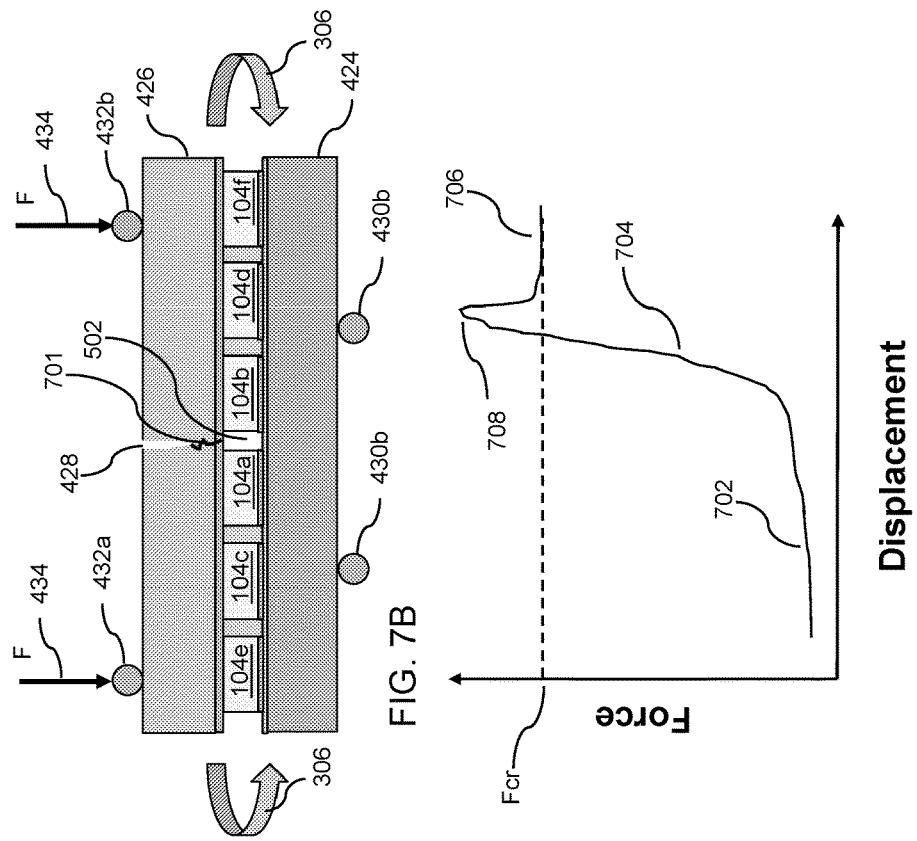
FIG. 7A
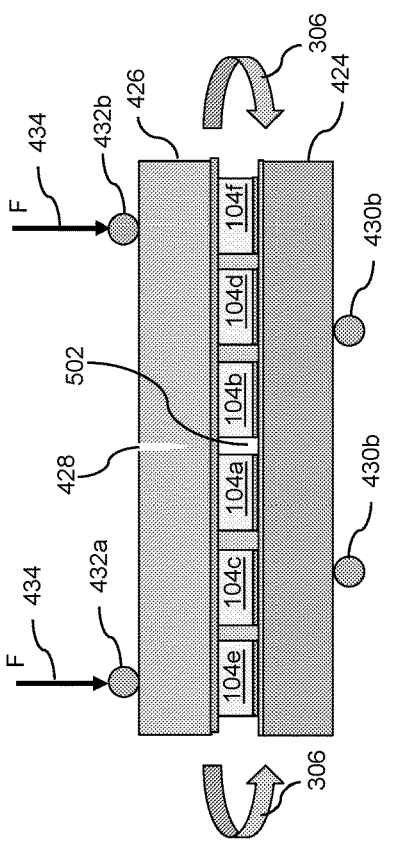
FIG. 7B
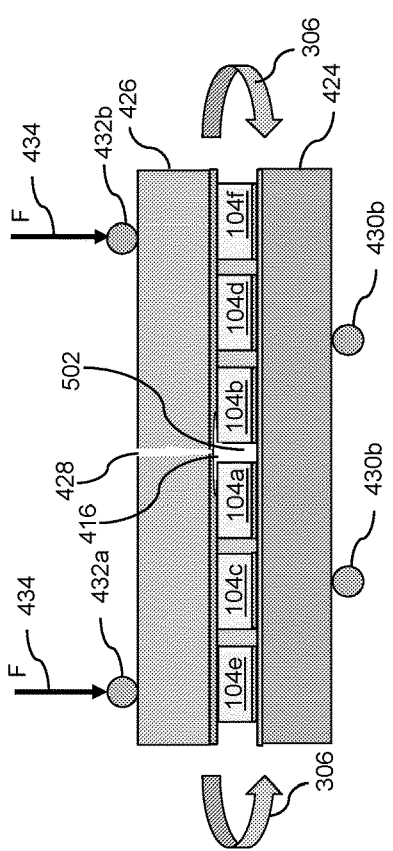
FIG. 7C
FIG. 7D

TEST STRUCTURES TO DETERMINE INTEGRATED CIRCUIT BONDING ENERGIES AND METHODS OF MAKING AND USING THE SAME

RELATED APPLICATIONS

This application claims priority from U.S. Provisional Application Ser. No. 63/406,755 entitled "Improved Test Structures To Determine Integrated Circuit Bonding Energies And Methods Of Making And Using The Same," filed on Sep. 15, 2022, the entire contents of which are incorporated herein by reference for all purposes.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds or thousands of integrated circuits are typically manufactured on a single semiconductor wafer, and individual dies on the wafer are singulated by sawing between the integrated circuits along scribe lines. The individual dies are typically packaged separately, in multi-chip modules, or in other types of packaging, for example.

In addition to smaller electronic components, improvements to the packaging of components have been developed to provide smaller packages that occupy less area than previous packages. Example approaches include quad flat pack (QFP), pin grid array (PGA), ball grid array (BGA), flip chips (FC), 3-dimensional integrated circuits (3DICs), wafer level packages (WLPs), package on package (PoP), System on Chip (SoC) or System on Integrated Circuit (SoIC) devices. Some of these 3-dimensional devices (e.g., 3DIC, SoC, SoIC) are prepared by placing chips over chips on a semiconductor wafer level. These 3-dimensional devices provide improved integration density and other advantages, such as faster speeds and higher bandwidth, because of the decreased length of interconnects between the stacked chips. However, there are many challenges related to fabricating and operating 3-dimensional devices such as mechanical issues related to thermal expansion mismatch between package components leading to warpage, cracking, delamination, etc.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a vertical cross-sectional view of a further exemplary structure in which thermal stresses may cause mechanical degradation, according to various embodiments.

FIG. 3B is a vertical cross-sectional view of an enlarged portion of the exemplary structure of FIG. 3A illustrating thermally induced deformations, according to various embodiments.

FIG. 3C is a top view of a portion of the exemplary structure of FIG. 3A showing thermally induced cracking, according to various embodiments.

FIG. 3D is a top view of a further portion of the exemplary structure of FIG. 3A showing thermally induced cracking, according to various embodiments.

FIG. 3E is a vertical cross-sectional view of a portion of the exemplary structure of FIG. 3A showing thermally induced delamination, according to various embodiments.

FIG. 3F is a vertical cross-sectional view of a further portion of the exemplary structure of FIG. 3A showing thermally induced delamination and cracking, according to various embodiments.

FIG. 7A is a vertical cross-sectional view of an interfacial bonding test structure in a first configuration during a four-point bend (4PB) test, according to various embodiments.

FIG. 7B is a vertical cross-sectional view of the interfacial bonding test structure of FIG. 7A in a further configuration during a 4PB test, according to various embodiments.

FIG. 7C is a vertical cross-sectional view of the interfacial bonding test structure of FIG. 7A in a further configuration during a 4PB test, according to various embodiments.

FIG. 7D is a graph that illustrates an example force vs. displacement profile that may be generated by a 4PB test, according to various embodiments.

DETAILED DESCRIPTION

Figure 1A:
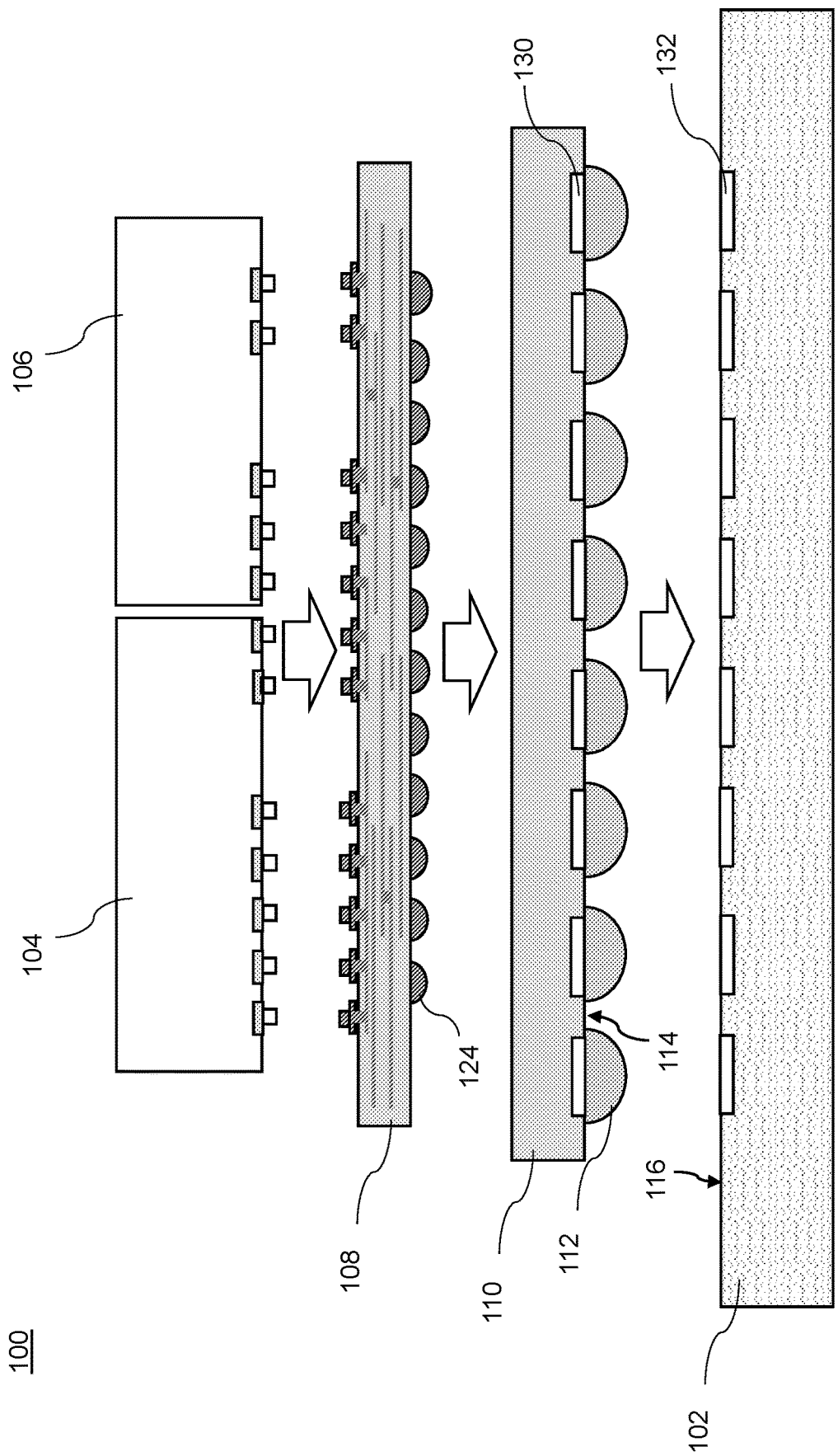
FIG. 1A is vertical cross-sectional exploded view of components of a semiconductor package during a package assembly and surface mounting process.

The following disclosure provides many different embodiments, or examples, for implementing various features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the disclosed example embodiments. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The chips mounted on the common substrate may also be referred to as a "package substrate." In some embodiments, electrical connections to the semiconductor package may be made by mounting the package substrate onto a support substrate containing electrical interconnects, such as a printed circuit board (PCB).

The various embodiments disclosed herein may provide improved systems and methods for mechanically testing components of semiconductor packages to reliably predict interfacial bonding energies. In this regard, an embodiment interfacial bonding test structure may include a plurality of semiconductor dies bonded between a first substrate and a second substrate such that the semiconductor dies, the first substrate, and the second substrate form a sandwich structure. The interfacial bonding test structure may be placed in a four-point bonding (4PB) test apparatus and may be subjected to bending moments. An interfacial bonding energy may be determined based on a critical force that generates steady-state interfacial crack propagation. The embodiment interfacial bonding test structures may allow determination of bonding energies for circuit components (e.g., the semiconductor dies) that may otherwise be too small to be tested using existing test structures and methods.

An embodiment interfacial bonding test structure may include a first substrate having a first planar surface, a second substrate having a second planar surface that is parallel to the first planar surface, a first semiconductor die, and a second semiconductor die, each semiconductor die bonded between the first substrate and the second substrate thereby forming a sandwich structure. The first semiconductor die and the second semiconductor die may be bonded to the first surface with a first adhesive and may be bonded to the second surface with a second adhesive. The first semiconductor die and the second semiconductor die may be displaced from one another by a first separation along a direction parallel to the first planar surface and the second planar surface. The second substrate may include a notch having an area that overlaps with an area of the first separation in a plan view.

An embodiment method of forming an interfacial bonding test structure may include bonding first sides of two or more semiconductor dies to a first substrate having a planar surface, bonding a second substrate to second sides of the two or more semiconductor dies such that the first substrate, the second substrate, and the two or more semiconductor dies form a sandwich structure, and forming a notch in the second substrate that partially penetrates through a thickness of the second substrate. Bonding the first sides of two or more semiconductor dies to the first substrate may further include locating the two or more semiconductor dies such that a first separation laterally separates a first semiconductor die from a second semiconductor die. Forming the notch may further include locating the notch such that an area of the notch overlaps with an area of the first separation in a plan view.

An embodiment method of determining an interfacial bonding energy of a first semiconductor die and a second semiconductor die, bonded to a first substrate and a second substrate, may include providing an interfacial bonding test structure comprising the first semiconductor die and the second semiconductor die each located between, and bonded to, the first substrate and the second substrate; placing the interfacial bonding test structure within a four-point bending apparatus such that the interfacial bonding test structure is supported from below by two support pins; applying forces to the interfacial bonding test structure with two forcing pins located above the interfacial bonding test structure to thereby apply a bending moment to the interfacial bonding test structure; determining a force vs. displacement profile of the forcing pins; and determining the interfacial bonding energy based on the determined force vs. displacement profile. In various embodiments, the second substrate may include a notch partially penetrating through a thickness of the second substrate.

Figure 1B:
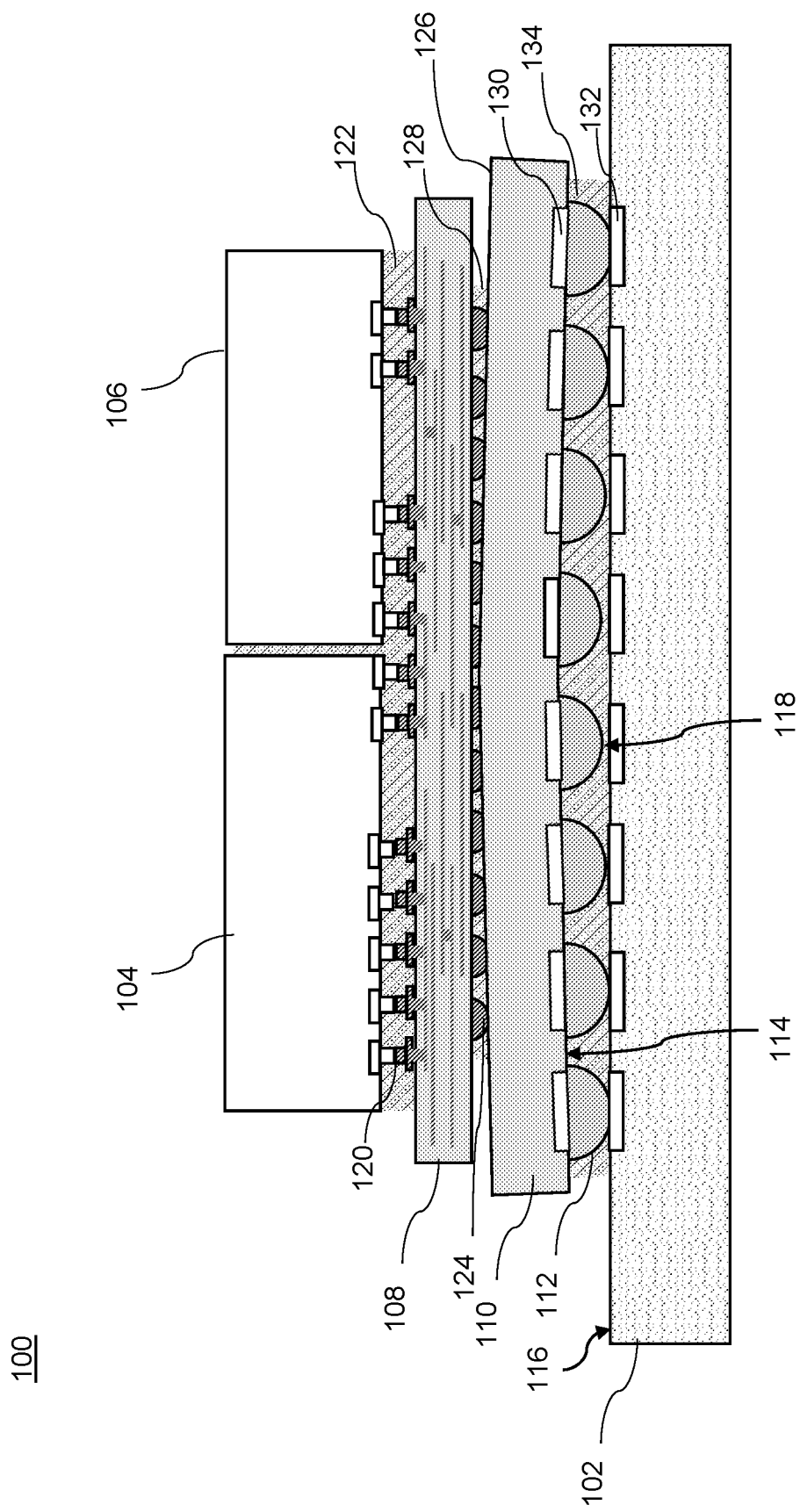
FIG. 1B is a vertical cross-sectional view illustrating an assembled semiconductor package mounted onto the surface of a support substrate.

FIG. 1A is vertical cross-section exploded view of components of a semiconductor package 100 during a package assembly and surface mounting process. FIG. 1B is a vertical cross-section view illustrating the assembled semiconductor package 100 mounted onto the surface of a support substrate 102, such as a printed circuit board (PCB). The semiconductor package 100 in this example is a chip-on-wafer-on-substrate (CoWoS)® semiconductor package, although it will be understood that a similar assembly and mounting process may be utilized for other types of semiconductor packages, such as integrated fan-out (InFO) semiconductor packages, flip-chip semiconductor packages, etc.

Referring to FIGS. 1A and 1B, the package 100 may include integrated circuit (IC) semiconductor dies, such as first semiconductor dies 104 and second semiconductor dies 106. During the package assembly process, the first semiconductor die 104 and the second semiconductor die 106 may be mounted on an interposer 108, and the interposer 108 containing the first semiconductor die 104 and the second semiconductor die 106 may be mounted onto a package substrate 110 to form a semiconductor package 100. The semiconductor package 100 may then be mounted to a support substrate 102, such as a printed circuit board (PCB), by mounting the package substrate 110 to the support substrate 102 using an array of solder balls 112 on the lower surface 114 of the package substrate 110.

A parameter that may ensure proper interconnection between the package substrate 110 and the support substrate 102 is the degree of co-planarity between the surfaces of the solder balls 112 that may be brought into contact with the mounting surface (i.e., the upper surface 116 of the support substrate 102 in FIG. 1A). A low amount of co-planarity between the solder balls 112 may result in instances of solder cold joints (i.e., insufficient melting of the solder material, resulting in a poor bond that is susceptible to cracking and separation) and/or solder bridging issues (i.e., solder material from one solder ball 112 contacting material from a neighboring solder ball 112, resulting in an unintended connection (i.e., electrical short)) during the reflow process.

Deformation of the package substrate 110, such as stress-induced warping of the package substrate 110, may be a contributor to low co-planarity of the solder balls 112 during surface mounting of the package substrate 110 onto a support substrate 102. FIG. 1B illustrates a package substrate 110 that includes a warpage deformation. The warp deformation of the package substrate 110 may result in variations of the distance between the lower surface 114 of the package substrate 110 and the upper surface 116 support substrate 102. Such deformation of the package substrate 110 may increase the risk of defective solder connections with the underlying support substrate 102. As shown in FIG. 1B, for example, a deformation of the package substrate 110 may cause at least some of the solder joints between the package substrate 110 and the support substrate 102 to fail completely, as indicated by the arrow 118 in FIG. 1B. In the exemplary embodiment shown in FIG. 1B, the deformation of the package substrate 110 may have a bow-shape or cup-shape such that a separation between the lower surface 114 of the package substrate 110 and the upper surface 116 of the support substrate 102 may be smallest at the periphery of the package substrate 110 and may increase towards the center of the package substrate 110.

Deformation of the package substrate 110 is not an uncommon occurrence, particularly in the case of semiconductor packages used in high-performance computing applications. These high-performance semiconductor packages 100 tend to be relatively large and may include a number of semiconductor dies (e.g., 104, 106) mounted to the package substrate 110. The thermal load generated by such semiconductor dies (e.g., 104, 106) and the differences in coefficients of thermal expansion (CTE) often results in warpage and other deformations of the package substrate 110 and other components of the semiconductor package 100. Such deformations may present challenges to effective solder mounting of these types of semiconductor package substrates 110 onto a support substrate 102.

According to various embodiments of this disclosure, a substrate for a semiconductor package 100 may include various reinforcing structures that may compensate for a deformation of the package substrate 110 so that the co-planarity of the solder balls 112 may be improved, thereby providing an improved solder connection between the package substrate 110 and the support substrate 102, as described in greater detail below.

In various embodiments, the first semiconductor dies 104 may be three-dimensional devices, such as three-dimensional integrated circuits (3DICs), System on Chip (SOC) or System on Integrated Circuit (SoIC) devices. A three-dimensional semiconductor device may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional semiconductor device may also be referred to as a "first die stack."

The second semiconductor device(s) 106 may be different from the first semiconductor device(s) 104 in terms of their structure, design and/or functionality. The one or more second semiconductor dies 106 may be three-dimensional semiconductor dies, which may also be referred to as "second die stacks." In some embodiments, the one or more second semiconductor dies 106 may include a memory device, such as a high bandwidth memory (HBM) device. In the example shown in FIGS. 1A and 1B, the semiconductor package 100 may include a SOC die stack 104 and an HBM die stack 106, although it will be understood that the semiconductor package 100 may include greater or fewer numbers of semiconductor dies.

Referring again to FIG. 1B, the first semiconductor dies 104 and second semiconductor dies 106 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer 108 are within the contemplated scope of the disclosure. The interposer 108 may include a plurality of conductive bonding pads on upper and lower surfaces of the interposer and a plurality of conductive interconnects extending through the interposer 108 between the upper and lower bonding pads of the interposer 108. The conductive interconnects may distribute and route electrical signals between the first semiconductor dies 104, the second semiconductor dies 106, and the underlying package substrate 110. Thus, the interposer 108 may also be referred to as a redistribution layer (RDL).

A plurality of metal bumps 120, such as microbumps, may electrically connect conductive bonding pads on the bottom surfaces of the first semiconductor dies 104 and second semiconductor dies 106 to the conductive bonding pads on the upper surface of the interposer 108. In one non-limiting embodiment, metal bumps 120 in the form of microbumps may include a plurality of first metal stacks, such as a plurality of Cu—Ni—Cu stacks, located on the bottom surfaces of the first semiconductor dies 104 and second semiconductor dies 106, and a plurality of second metal stacks (e.g., Cu—Ni—Cu stacks) located on the upper surface of the interposer 108. A solder material, such as tin (Sn), may be located between respective first and second metal stacks to electrically connect the first semiconductor dies 104 and the second semiconductor dies 106 to the interposer 108. Other suitable materials for the metal bumps 120 are within the contemplated scope of disclosure.

After the first semiconductor dies 104 and second semiconductor dies 106 are mounted to the interposer 108, a first underfill material portion 122 may optionally be provided in the spaces surrounding the metal bumps 120 and between the bottom surfaces of the first semiconductor dies 104, the second semiconductor dies 106, and the upper surface of the interposer 108 as shown in FIG. 1B. The first underfill material portion 122 may also be provided in the spaces laterally separating adjacent first semiconductor dies 104 and second semiconductor dies 106 of the semiconductor package 100. In various embodiments, the first underfill material portion 122 may be include of an epoxy-based material, which may include a composite of resin and filler materials.

Referring again to FIG. 1B, the interposer 108 may be mounted on the package substrate 110 that may provide mechanical support for the interposer 108 and the first semiconductor dies 104 and second semiconductor dies 106 that are mounted on the interposer 108. The package substrate 110 may include a suitable material, such as an organic material (e.g., a polymer and/or thermoplastic material), a semiconductor material (e.g., a semiconductor wafer, such as a silicon wafer), a ceramic material, a glass material, combinations thereof, or the like. Other suitable substrate materials are within the contemplated scope of present disclosure. In various embodiments, the package substrate 110 may include a plurality of conductive bonding pads (not shown) in an upper surface 126 of the package substrate 110. A plurality of metal bumps 124, such as C4 solder bumps, may electrically connect conductive bonding pads (not shown) on the bottom surface of the interposer 108 to the conductive bonding pads on the upper surface 126 of the package substrate 110. In various embodiments, the metal bumps 124 may include a suitable solder material, such as tin (Sn), although other suitable solder materials are within the contemplated scope of disclosure.

A second underfill material portion 128 may be provided in the spaces surrounding the metal bumps 124 and between the bottom surface of the interposer 108 and the upper surface 126 of the package substrate 110 as illustrated, for example, in FIG. 1B. In various embodiments, the second underfill material portion 128 may include an epoxy-based material, which may include a composite of resin and filler materials. In some embodiments, a lid or cover (not shown in FIGS. 1A and 1B) may be mounted to the package substrate 110 and may provide an enclosure around the upper and side surfaces of the first semiconductor dies 104 and second semiconductor dies 106.

As described above, the package substrate 110 may be mounted to the support substrate 102, such as a printed circuit board (PCB). Other suitable support substrates 102 are within the contemplated scope of disclosure. The package substrate 110 may include a plurality of conductive bonding pads 130 in a lower surface 114 of the package substrate 110. A plurality of conductive interconnects (not shown) may extend through the package substrate 110 between conductive bonding pads on the upper surface 126 and lower surface 114 of the package substrate 110. The plurality of solder balls (or bump structures) 112 may electrically connect the conductive bonding pads 130 on the lower surface 114 of the package substrate 110 to a plurality of conductive bonding pads 132 on the upper surface 116 of the support substrate 102.

The bonding pads 130 of the package substrate 110 and bonding pads 132 of the support substrate 102 may be formed of a suitable conductive material, such as copper. Other suitable conductive materials are within the contemplated scope of disclosure. The plurality of solder balls 112 on the lower surface 114 of the package substrate 110 may form an array of solder balls 112, such as a ball grid array (BGA) that may include an array pattern that corresponds to an array pattern of the conductive bonding pads 132 on the upper surface 116 of the support substrate 102. In one non-limiting example, the array of solder balls 112 may include a grid pattern and may have a pitch (i.e., distance between the center of each solder ball 112 and the center of each adjacent solder ball 112). In an example embodiment, the pitch may be between about 0.8 and 1.0 mm, although larger and smaller pitches may be used.

The solder balls 112 may include any suitable solder material, such as tin, lead, silver, indium, zinc, nickel, bismuth, antimony, cobalt, copper, germanium, alloys thereof, combinations thereof, or the like. Other suitable materials for the solder balls 112 are within the contemplated scope of disclosure.

In some embodiments, the lower surface 114 of the package substrate 110 may include a coating of solder resist (SR) material (not shown), which may also be referred to as a "solder mask". A SR material coating may provide a protective coating for the package substrate 110 and any underlying circuit patterns formed on or within the package substrate 110. An SR material coating may also inhibit solder material from adhering to the lower surface 114 of the package substrate 110 during a reflow process. In embodiments in which the lower surface 114 of the package substrate 110 includes an SR coating, the SR material coating may include a plurality of openings through which the bonding pads 130 may be exposed.

In various embodiments, each of the conductive bonding pads 130 in different regions of the package substrate 110 may have the same size and shape. In the embodiment shown in FIGS. 1A and 1B, the surfaces of the bonding pads 130 may be substantially co-planar with the lower surface 114 of the package substrate 110, which in some embodiments may include a solder resist (SR) coating. Alternatively, the surfaces of the bonding pads 130 may be recessed relative to the lower surface 114 of the package substrate 110. In some embodiments, the surfaces of the bonding pads 130 may be raised relative to the lower surface 114 of the package substrate 110.

Referring again to FIGS. 1A and 1B, solder balls 112 may be provided over the respective conductive bonding pads 130. In one non-limiting example, the conductive bonding pads 130 may have a width dimension that is between about 500 μm and about 550 μm (e.g., ~530 μm), and the solder balls 112 may have an outer diameter that may be between about 600 μm and about 650 μm (e.g., ~630 μm), although greater and lesser dimensions for the solder balls 112 and/or the bonding pads 130 are within the contemplated scope of disclosure.

A first solder reflow process may include subjecting the package substrate 110 to an elevated temperature (e.g., at least about 250° C.) in order to melt the solder balls 112 and cause the solder balls 112 to adhere to the conductive bonding pads 130. Following the first reflow process, the package substrate 110 may be cooled causing the solder balls 112 to re-solidify. Following the first solder reflow process, the solder balls 112 may adhere to the conductive bonding pads 130. Each solder ball 112 may extend from the lower surface 114 of the package substrate 110 by a vertical height that may be less than the outer diameter of the solder ball 112 prior to the first reflow process. For example, where the outer diameter of the solder ball 112 is between about 600 µm and about 650 µm (e.g., ~630 µm), the vertical height of the solder ball 112 following the first reflow process may be between about 500 µm and about 550 µm (e.g., ~520 µm).

In various embodiments, the process of mounting the package substrate 110 onto the support substrate 102 as shown in FIG. 1B, may include aligning the package substrate 110 over the support substrate 102, such that the solder balls 112 contacting the conductive bonding pads 130 of the package substrate 110 may be located over corresponding bonding pads (e.g., bonding pads 132) on the support substrate 102. A second solder reflow process may then be performed. The second solder reflow process may include subjecting the package substrate 110 to an elevated temperature (e.g., at least about 250° C.) to thereby melt the solder balls 112 and cause the solder balls 112 to adhere to the corresponding bonding pads 132 on the support substrate 102. Surface tension may cause the semi-liquid solder to maintain the package substrate 110 in alignment with the support substrate 102 while the solder material cools and solidifies. Upon solidification of the solder balls 112, the package substrate 110 may sit above the upper surface 116 of the support substrate 102 by a stand-off height that may be between about 0.4 mm to about 0.5 mm, although greater or lesser stand-of heights are within the contemplated scope of disclosure.

Following the mounting of the package substrate 110 to the surface substrate 102, a third underfill material portion 134 may be provided in the spaces surrounding the solder balls 112 and between the lower surface 114 of the package substrate 110 and the upper surface 116 of the support substrate 102, as is shown in FIG. 1B. In various embodiments, the third underfill material portion 134 may include an epoxy-based material, which may include a composite of resin and filler materials.

Figure 2A:
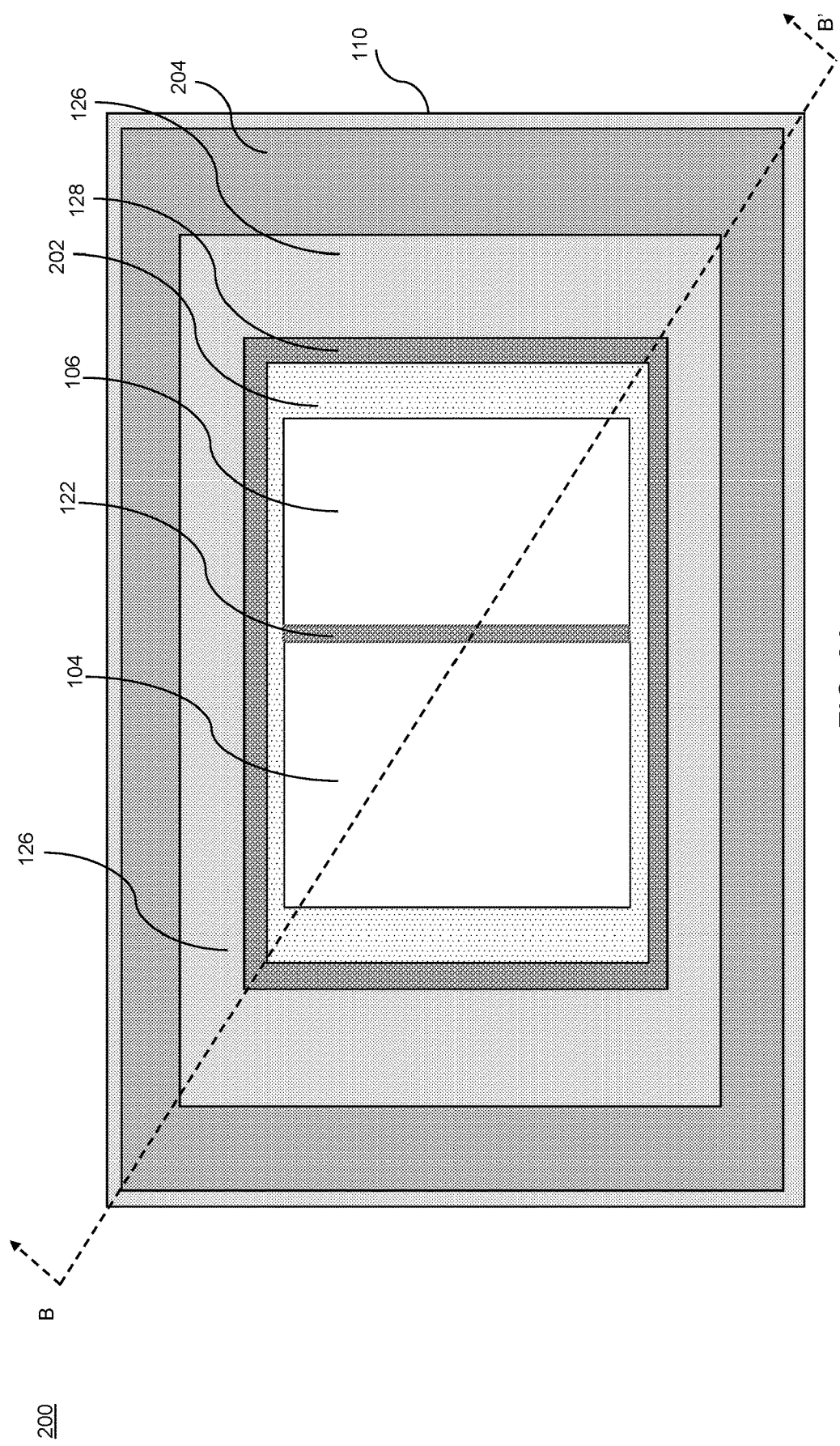
FIG. 2A is a top view of a semiconductor package including a first reinforcement structure.

FIG. 2A is a top view of a semiconductor package 200 including a first reinforcement structure 204 (such as a stiffener ring), which may be provided to reduce or eliminate the warpage distortion of the package substrate 110 shown in FIG. 1B. The dashed line labeled B-B' indicates the cross-sectional view of the semiconductor package 200 shown in FIG. 2B, as described in greater detail, below. The semiconductor package 200 may be similar to the semiconductor package 100 of FIGS. 1A and 1B. In this regard, the semiconductor package 200 may include a first semiconductor die 104 and a second semiconductor die 106 mounted to an interposer 108 (e.g., see FIG. 2B). The interposer 108 may be mounted to a package substrate 110, as described above with reference to FIGS. 1A and 1B. The semiconductor package 200 may include a first underfill material portion 122 provided in the spaces laterally separating adjacent first semiconductor die 104 and second semiconductor die 106 of the semiconductor package 200. The semiconductor package 200 may also include a second underfill material portion 128 may be provided in the spaces surrounding the metal bumps 124 and between the bottom surface of the interposer 108 and the upper surface 126 of the package substrate 110 as illustrated, for example, in FIG. 2B.

The semiconductor package 200 may further include an epoxy molding compound (EMC) that may be applied to gaps formed between the interposer 108, the first semiconductor die 104, and the second semiconductor die 106, to thereby form a multi-die EMC frame 202. The EMC material may include an epoxy-containing compound that may be hardened (i.e., cured) to provide a dielectric material portion having sufficient stiffness and mechanical strength. The EMC material may include epoxy resin, hardener, silica (as a filler material), and other additives. The EMC material may be provided in a liquid form or in a solid form depending on the viscosity and flowability.

Liquid EMC may provide better handling, good flowability, fewer voids, better fill, and fewer flow marks. Solid EMC may provide less cure shrinkage, better stand-off, and less die drift. A high filler content (such as 85% in weight) within an EMC material may shorten the time in mold, lower the mold shrinkage, and reduce the mold warpage. A uniform filler size distribution in the EMC material may reduce flow marks and may enhance flowability. The curing temperature of the EMC material may be in a range from 125° C. to 150° C. The EMC frame 202 may be cured at a curing temperature to form an EMC matrix that laterally encloses each of the first semiconductor die 104 and the second semiconductor die 106. Excess portions of the EMC frame 202 may be removed from above the horizontal plane including the top surfaces of the semiconductor dies (104, 106) by a planarization process, such as CMP.

Figure 2B:
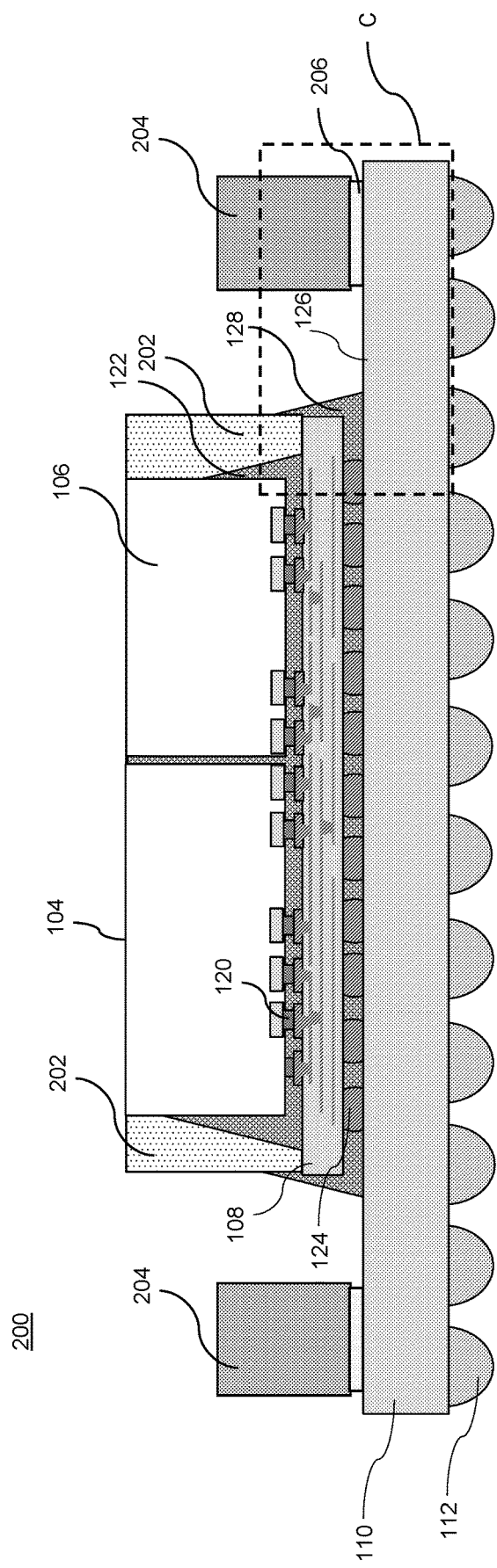
FIG. 2B is a vertical cross-sectional view of the semiconductor package along line BB' in FIG. 2A.

FIG. 2B is a cross-sectional view of the semiconductor package 200 of FIG. 2A. The first reinforcement structure 204 may be attached to the package substrate 110 with an adhesive 206 and may be formed of a metal, an insulator, a semiconductor, a ceramic, etc. For example, in one embodiment, the first reinforcement structure 204 may include copper at an atomic percentage greater than 80%, such as greater than 90% and/or greater than 95% although greater or lesser percentages may be used. As shown in FIG. 2A, the first reinforcement structure 204 may be configured as a ring located around a periphery of the package substrate 110. As such, the first reinforcement structure 204 may form a single structure. Alternatively, the first reinforcement structure 204 may include several disconnected portions (not shown). Further, the first reinforcement structure 204 need not be located near the periphery of the package substrate 110. Rather, the first reinforcement structure 204 may located on the package substrate 110 in any region that may be subject to mechanical distortions such as warping.

The first reinforcement structure 204 may provide increased mechanical support to the package substrate 110 to thereby reduce or eliminate mechanical distortions such as the warping of the package substrate 110 described above and illustrated, for example, in FIG. 1B. The first reinforcement structure 204 may therefore be chosen to have a mechanical strength (e.g., bulk modulus) that is greater than that of the package substrate 110. As discussed above, the package substrate 110 may include an organic material (e.g., a polymer and/or thermoplastic material), a semiconductor material (e.g., a semiconductor wafer, such as a silicon wafer), a ceramic material, a glass material, combinations thereof, etc. As such, the choice of material for the first reinforcement structure 204 may be chosen based on the mechanical properties of the package substrate 110. As shown in FIG. 2B, for example, the presence of the first reinforcement structure 204 may reduce or eliminate the warpage distortion of the package substrate 110 shown in FIG. 1B. However, the presence of the first reinforcement structure 204 may give rise to other mechanical issues as described in greater detail with reference to FIG. 2C, below.

Figure 2C:
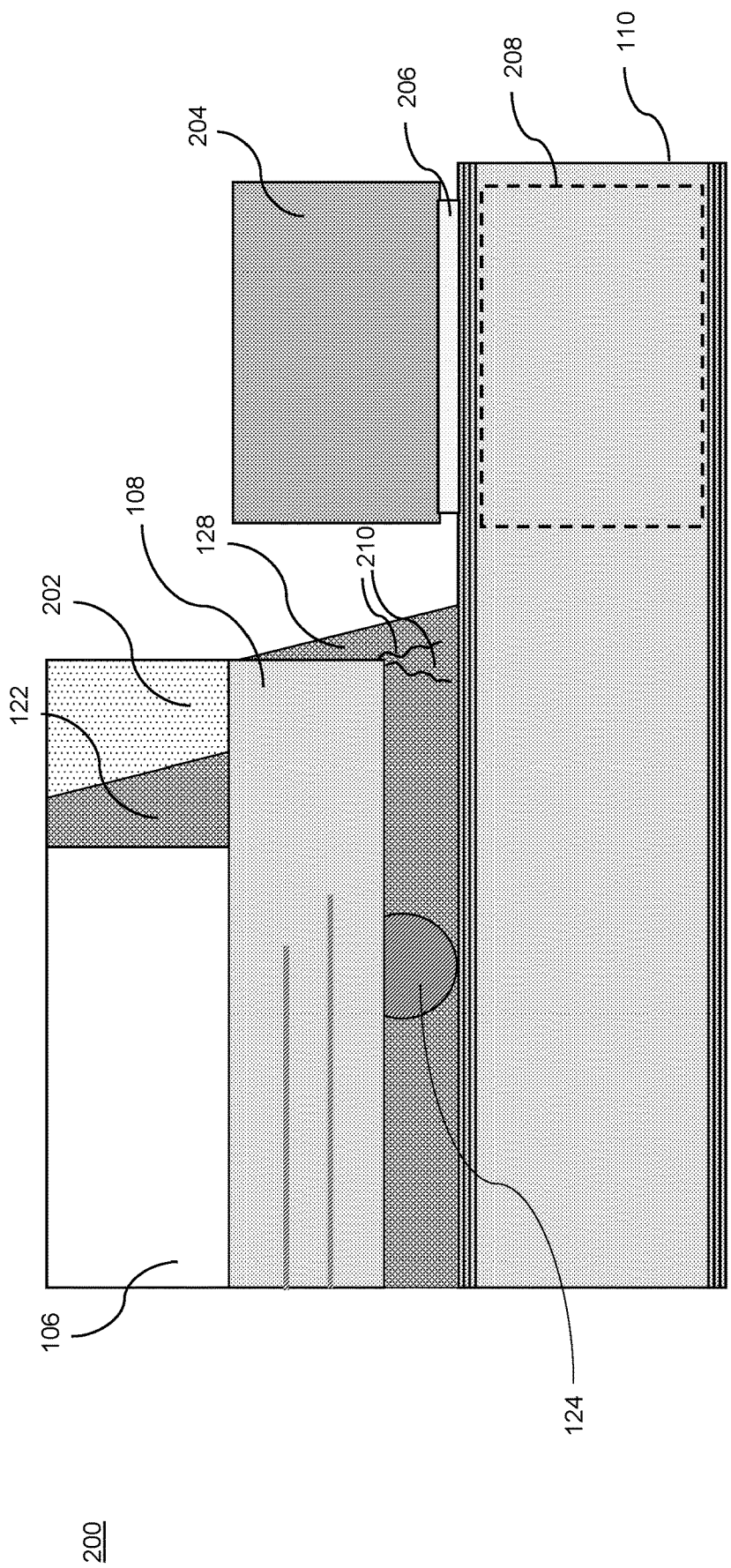
FIG. 2C is a vertical cross-sectional view of an enlarged portion of the semiconductor package of FIG. 2B.

FIG. 2C is a cross-sectional view of an enlarged portion of the semiconductor package of FIG. 2B. The region shown in FIG. 2C is illustrated in the dashed rectangle labeled C in FIG. 2B. For certain material compositions, there may be a mismatch in thermal expansion coefficients of components of the semiconductor package 200 relative to a thermal expansion coefficient of the first reinforcement structure 204. As such, thermal expansion stresses may develop during thermal cycling. Such thermal stresses may lead to mechanical degradation of the semiconductor package 200. For example, as shown in FIG. 2C, cracks 210 may develop in the second underfill material portion 128. Further, the second underfill material portion 128 may become delaminated (not shown) from the package substrate 110 and/or from the interposer 108. In various disclosed embodiments, a second reinforcement structure may be provided to compensate the thermal stresses developed between components of the semiconductor package 200 the first reinforcement structure 204. For example, a second reinforcement structure may be formed within the package substrate 110 (e.g., within region 208), in various embodiments.

FIG. 3A is a vertical cross-sectional view of a further exemplary structure in which thermal stresses may cause mechanical degradation, and FIG. 3B is a vertical cross-sectional view of an enlarged portion of the exemplary structure of FIG. 3A illustrating thermally-induced deformations, according to various embodiments. FIGS. 3C and 3D are top views of respective portions of the exemplary structure of FIG. 3A, and FIGS. 3E and 3F are vertical cross-section views of respective portions of the exemplary structure of FIG. 3A, according to various embodiments. The exemplary structure of FIG. 3A may be similar to the exemplary structure of FIGS. 1A to 2C. In this regard, the exemplary structure of 3A may include a fan-out package 300, which may include an interposer 108 electrically coupled to one or more semiconductor dies (104, 106), and a package substrate 110 electrically coupled to the interposer 108. A first underfill material portion 122 may be formed in contact with the interposer 108 and the one or more semiconductor dies (104, 106), and a second underfill material portion 128 may be formed between the interposer 108 and the package substrate 110. A multi-die EMC frame 202 may be formed in contact with the one or more semiconductor dies (104, 106) and the interposer 108 and may provide mechanical support to the one or more semiconductor dies (104, 106) and the interposer 108.

Thermally-induced stresses/strains may develop during thermal cycling due to a mismatch between the thermal expansion coefficients of the various components of the exemplary structure of FIG. 3A. Such stresses/strains may lead to mechanical degradation such as cracking, delamination, etc. For example, the one or more semiconductor dies (104, 106) may have a thermal expansion coefficient that may be in a range from approximately 4 ppm/° C. to approximately 5 ppm/° C. while the package substrate 110 may have a thermal expansion coefficient that is in a range from approximately 12 ppm/° C. to approximately 19 ppm/° C. Thus, upon cooling from a first temperature to a second temperature, the package substrate 110 may tend to mechanically contract (i.e., shrink) to a greater degree than a corresponding contraction of the fan-out package 300. As such, a first thermal contraction stress 302 may develop in the package substrate 110, and a second thermal contraction stress 304 may develop in the fan-out package 300. As indicated by the size of the arrows corresponding to the first thermal contraction stress 302 relative to the size of the arrows corresponding to the second thermal contraction stress 304, the first thermal contraction stress 302 may be larger than the second thermal contraction stress 304. Such a difference in stresses may generate bending moments 306 that may cause deformation of the various components of the exemplary structure of FIG. 3A relative to one another as shown, for example, in FIG. 3B. Although in this example embodiment, thermal contraction stresses/strains are described, similar thermal expansion stresses/strains may also develop in response to temperature increases of the exemplary structure of FIG. 3A.

As mentioned above, FIG. 3B is a vertical cross-sectional view of an enlarged portion of the exemplary structure of FIG. 3A illustrating thermally-induced deformations. As shown, the bending moments 306 may generate tensile stresses 308 at interfaces between the first semiconductor die 104 and the first underfill material portion 122, and between the second semiconductor die 106 and the first underfill material portion 122. Additional stresses/strains (shear as well as tensile/compressive) may develop between various other interfaces, such as interfaces between the multi-die EMC frame 202 and the one or more semiconductor dies (104, 106), between the first underfill material portion 122 and the interposer 108, between the second underfill material portion 128 and the interposer 108, between the second underfill material portion 128 and the package substrate 110, etc. Such stresses may lead to cracking, delamination, and other mechanical degradation, as described in greater detail with reference to FIGS. 3C to 3F, below.

FIG. 3C is a top view of a portion of the fan-out package 300, of the exemplary structure of FIG. 3A, in which a first crack 310 may be formed in the multi-die EMC frame 202, according to various embodiments. The first crack 310 may be caused due to thermally-induced stresses/strains at interfaces between the multi-die EMC frame 202 and the second semiconductor die 106. For example, the second semiconductor die 106 may have a lower coefficient of thermal expansion than that of the multi-die EMC frame 202. Under a certain range of temperature variation (e.g., temperature reduction in this example) thermal stresses may develop that may exceed a threshold for crack formation. For example, sharp geometrical features, such as the corner of the second semiconductor die 106, may lead to a stress concentration at the corner. In this example, the stress concentration may have a maximum value at the corner of the second semiconductor die 106 such that the first crack 310 may nucleate from the corner of the second semiconductor die 106. Once initiated, the first crack 310 may propagate within the multi-die EMC frame 202, as shown in FIG. 3C.

FIG. 3D is a top view of another portion of the fan-out package 300, of the exemplary structure of FIG. 3A. As shown, the top view of FIG. 3D illustrates interfaces between the first underfill material portion 122 and the first semiconductor die 104, between the first underfill material portion 122 and the semiconductor die 106, and between the first underfill material portion 122 a third semiconductor die 107. In this example embodiment, a second crack 312 and a third crack 314 may develop in the first underfill material portion 122. As described above, one or both of the second crack 312 and the third crack 314 may nucleate from stresses concentrated at or near corners of the second semiconductor die 106 and the third semiconductor die 107. Alternatively, cracks may be initiated at flat interfaces and may propagate within the first underfill material portion 122. For example, the second crack 312 may be initiated at the interface between the first semiconductor die 104 and the first underfill material portion 122 and may propagate within the first underfill material portion 122 toward the third semiconductor die 107. Various other thermally-induced deformations may occur, such as delamination and cracks that propagate into other components, as described in greater detail with reference to FIGS. 3E and 3F, below.

As mentioned above, FIGS. 3E and 3F are vertical cross-section views of respective portions of the exemplary structure of FIG. 3A in which thermally-induced delamination and cracking may occur, according to various embodiments. The view of FIG. 3E shows interfaces between the multi-die EMC frame 202 and the second semiconductor die 106, between the multi-die EMC frame 202 and the first underfill material portion 122, between the first underfill material portion 122 and the second semiconductor die 106, and between the first underfill material portion 122 and the interposer 108. Cracks and/or delamination may occur at one or more of these interfaces. For example, a first delamination 316 may occur at the interface between the multi-die EMC frame 202 and the second semiconductor die 106, as shown. Similarly, a second delamination 318 may occur between the first underfill material portion 122 and the multi-die EMC frame 202. Other mechanical degradations may involve two or more components as shown, for example, in FIG. 3F as described in greater detail, below.

FIG. 3F is a vertical cross-sectional view of a further portion of the exemplary structure of FIG. 3A showing thermally induced delamination and cracking, according to various embodiments. The view of FIG. 3F shows interfaces between the first underfill material portion 122 and the second semiconductor die 106, between the first underfill material portion 122 and the third semiconductor die 107, and between first underfill material portion 122, and the interposer 108. As shown, a third delamination 320 may form between the first underfill material portion 122 and the third semiconductor die 107. As such, the first underfill material portion 122 may become de-bonded (i.e., delaminated) from a surface of the third semiconductor die 107.

The delamination (i.e., the third delamination 320) of the portion of the first underfill material portion 122 from the third semiconductor die 107 may relieve a thermal stress that previously existed at the interface between the first underfill material portion 122 the third semiconductor die 107. However, such a delamination may give rise to a displacement of a surface of the first underfill material portion 122 relative to a surface of the third semiconductor die 107. Such a displacement may cause further stress in a remaining constrained portion of the first underfill material portion 122, which may thereby nucleate a fourth crack 322 in the first underfill material portion 122. The displacement of respective surfaces of the fourth crack 322 may generate additional stresses at the interface between the first underfill material portion 122 and the interposer 108. Such additional stresses may generate a fifth crack 324 that may propagate within the interposer 108. Such a propagating fifth crack 324 may further propagate through one or more chip-side wiring interconnects 326 thereby causing damage to such interconnects.

Figure 3G:
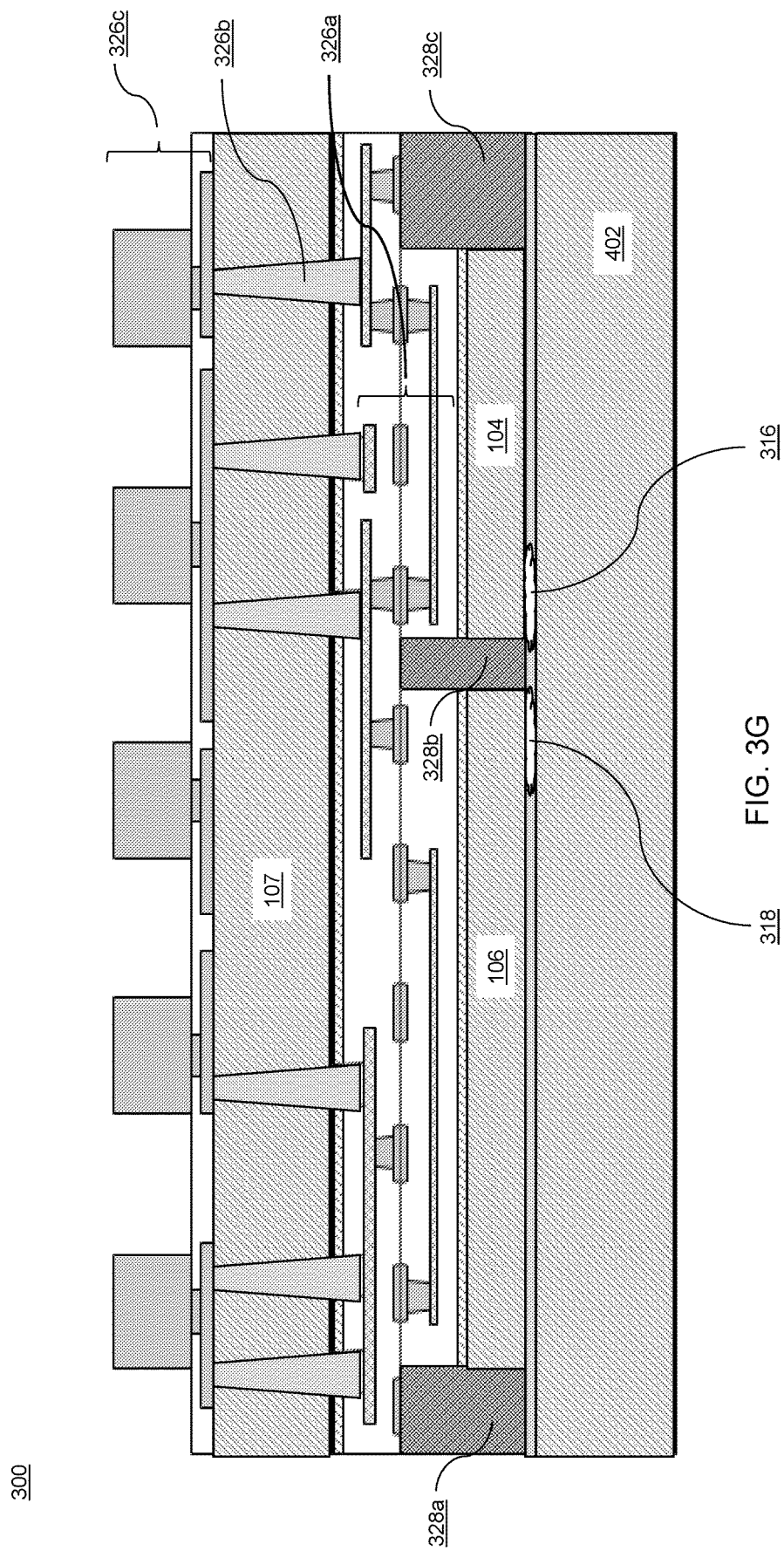
FIG. 3G is a vertical cross-sectional view of a further exemplary structure in which thermal stresses may cause mechanical degradation, according to various embodiments.

FIG. 3G is a vertical cross-sectional view of a further exemplary structure 300 in which thermal stresses may cause mechanical degradation, according to various embodiments. The exemplary structure 300 may be configured as a SoIC device and may include a first semiconductor die 104, a second semiconductor die 106, and a third semiconductor die 107. Other embodiments may include greater or fewer semiconductor dies. As shown, the first semiconductor die 104 and the second semiconductor die 106 may each be mounted to a substrate 402. The substrate 104 may have various wiring interconnects (not shown) or the substrate 402 may be a slab of material (e.g., a silicon or SoI substrate) that provides mechanical support for the first semiconductor die 104 and the second semiconductor die 106.

The exemplary structure 300 may further include various electrical interconnect structures (326a, 326b, 326c) that may be supported by support structures (328a, 328b, 328c). The electrical interconnect structures (326a, 326b, 326c) may include a first interconnect level 326a that may provide electrical connections between the first semiconductor die 104, the second semiconductor die 106, and the third semiconductor die 107. The electrical interconnect structures (326a, 326b, 326c) may further include a second interconnect level that may include one or more through-silicon vias 326b. The through-silicon vias 326b may be configured to provide direct electrical connections between the first interconnect level 326a and a third interconnect level 326c. In this regard, the through-silicon vias 326b may bypass internal electrical interconnect structures (not shown) within the third semiconductor die 107.

As described above with reference to FIGS. 2C to 3F, various mechanical degradations may occur during thermal cycling do to thermal expansion coefficient mismatches between various components of the exemplary structure 300. For example, as shown in FIG. 3G, a first delamination 316 may form between the first semiconductor die 104 and the substrate 402. Similarly, a second delamination 318 may form between the second semiconductor die 104 and the substrate 402. The first delamination 316 and the second delamination 318 may form due to bending moments 306 (e.g., see FIGS. 3A and 3B) caused by thermal stresses that may arise during thermal cycling, as described in greater detail with reference to FIG. 4C, below. To avoid delaminations (316, 318) and other mechanical degradation, accurate determination of interfacial bonding strengths may be advantageous for improving semiconductor package designs. As such, various disclosed embodiments provide improved testing methods and apparatus to determine interfacial bonding strengths, as described in greater detail with reference to FIGS. 5A to 7D, below.

Figure 4B:
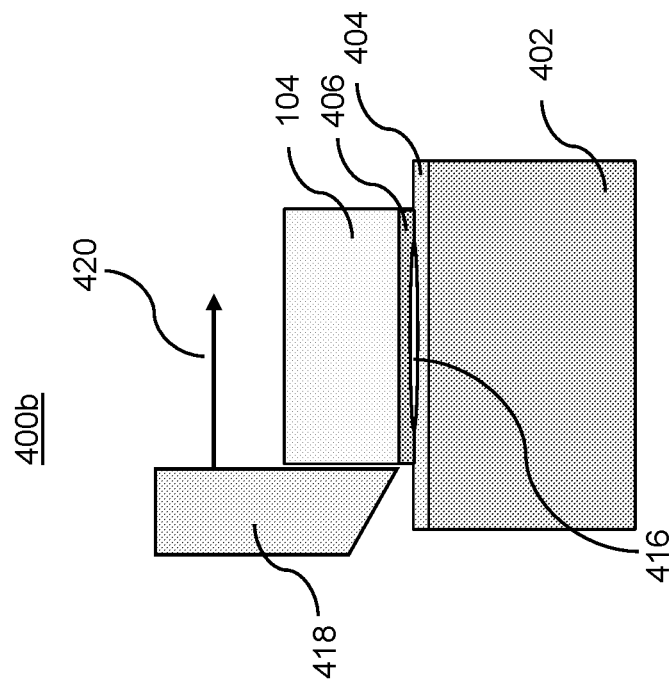
FIG. 4B is a vertical cross-sectional view of a second test apparatus that may be used to characterize a bonding strength of a semiconductor die to a substrate.
Figure 4A:
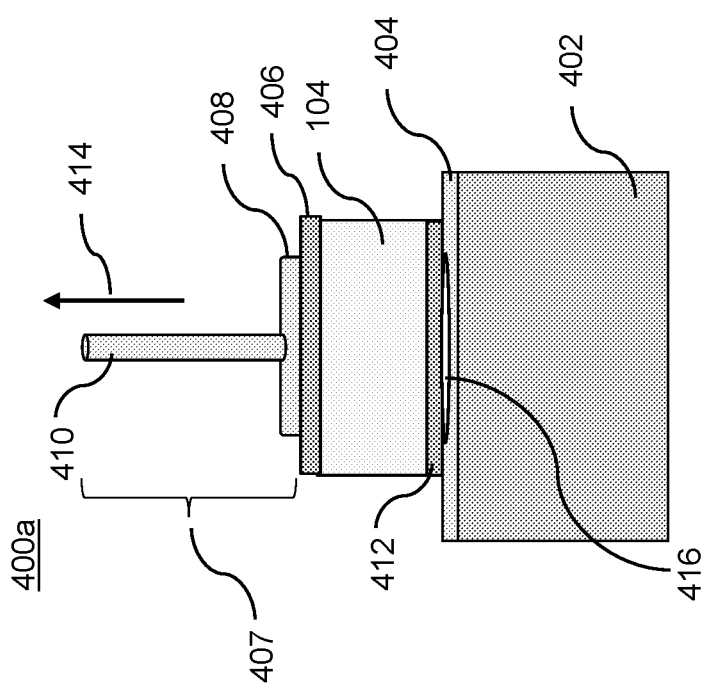
FIG. 4A is a vertical cross-sectional view of a first test apparatus that may be used to characterize a bonding strength of a semiconductor die to a substrate.

FIG. 4A is a vertical cross-sectional view of a first test apparatus 400a that may be used to characterize a bonding strength of a first semiconductor die 104 to a substrate 402. The first semiconductor die 104 may be bonded to the substrate using one or more adhesives. For example, a first adhesive 404 may be formed between the substrate 402 and the first semiconductor die 104. A movable stud 407 having a flat bottom portion 408 and a handle portion 410 may be attached to the first semiconductor die 104 as shown in FIG. 4A. In this regard, a second adhesive 406 may be formed between a top surface of the first semiconductor die 104 and the flat bottom portion 408 of the stud. In some embodiments, a third adhesive 412 may be formed between the first adhesive 404 and the first semiconductor die 104. The first adhesive 404 may be, for example, a first underfill material portion 122 and the second adhesive 406 may be an epoxy material such as may be used to form the multi-die EMC frame 202, described above. Various other adhesives may be used in other embodiments. Also, other embodiments may include a single adhesive (i.e., a common adhesive material) rather than two or three adhesives.

A bonding strength may be determined by applying a first force 414 on the handle portion 410 of the stud 407 while holding the substrate 402 in a stationary configuration. The first force 414 may be increased until fracture occurs at of one of the interfaces associated with the first semiconductor die 104. For example, assuming the second adhesive 406 is stronger than one or both of the first adhesive 404 and the third adhesive 412 (if present), an interface delamination (or a crack) 416 may develop between the first adhesive 404 and the third adhesive 412, between the first adhesive 404 and the substrate 402 (crack not shown), or between the third adhesive 412 and a bottom surface of the first semiconductor die 104 (crack not shown).

The bonding strength of the semiconductor die 104 to the substrate 402 may be characterized by a critical value of the first force 414 at which fracture occurs or at which an interface delamination 416 is initiated and begins to propagate. As shown in FIG. 4A, the first force 414 may be applied in a direction that is perpendicular to a surface of the first semiconductor die 104. As such, the first force 414 acts as a tensile force that generates stresses/strains that are purely tensile (i.e., mode I stresses/strains). Various other testing structures may be used to characterize the interfacial bonding strength in response to other types of stresses/strains such as shear stresses/strains (i.e., mode II stresses/strains) and mixed mode (i.e., shear combined with tensile/compressive) stresses/strains.

FIG. 4B is a vertical cross-sectional view of a second test apparatus 400*b* that may be used to characterize a bonding strength of a first semiconductor die 104 to a substrate 402. The first semiconductor die 104 may be bonded to the substrate 402 using one or more adhesives. For example, a first adhesive 404 may be formed over the substrate 402 and a second adhesive 406 may be formed between the first semiconductor die 104 and the first adhesive 404. The first adhesive 404 may be, for example, a first underfill material portion 122 and the second adhesive 406 may be an epoxy material such as may be used to form the multi-die EMC frame 202, described above (e.g., see FIG. 2A to 3E). Various other adhesives may be used in other embodiments. Also, other embodiments may use a single adhesive (i.e., a common adhesive material) rather than the first adhesive 404 and the second adhesive 406.

The second test apparatus 400*b* may further include a wedge-shaped shear tool 418 that may be configured to apply a shear stress (i.e., mode II stress) to the first semiconductor die 104. In this regard, the shear tool 418 may be moved in a direction parallel to a surface of the first semiconductor die 104 while the substrate 402 is held in a stationary configuration to thereby generate a second force 420. The second force 420 may be increased until an interface delamination 416 is nucleated or until interfacial fracture occurs. In this regard, an interface delamination 416 may develop between the first adhesive 404 and the second adhesive 406, between the first adhesive 404 and the substrate (crack not shown), or between the second adhesive 406 and a bottom surface of the first semiconductor die 104 (crack not shown). The bonding strength of the semiconductor die 104 to the substrate 402 may be characterized by a critical value of the second force 420 at which fracture occurs or at which an interface delamination 416 is initiated and begins to propagate.

Figure 4C:
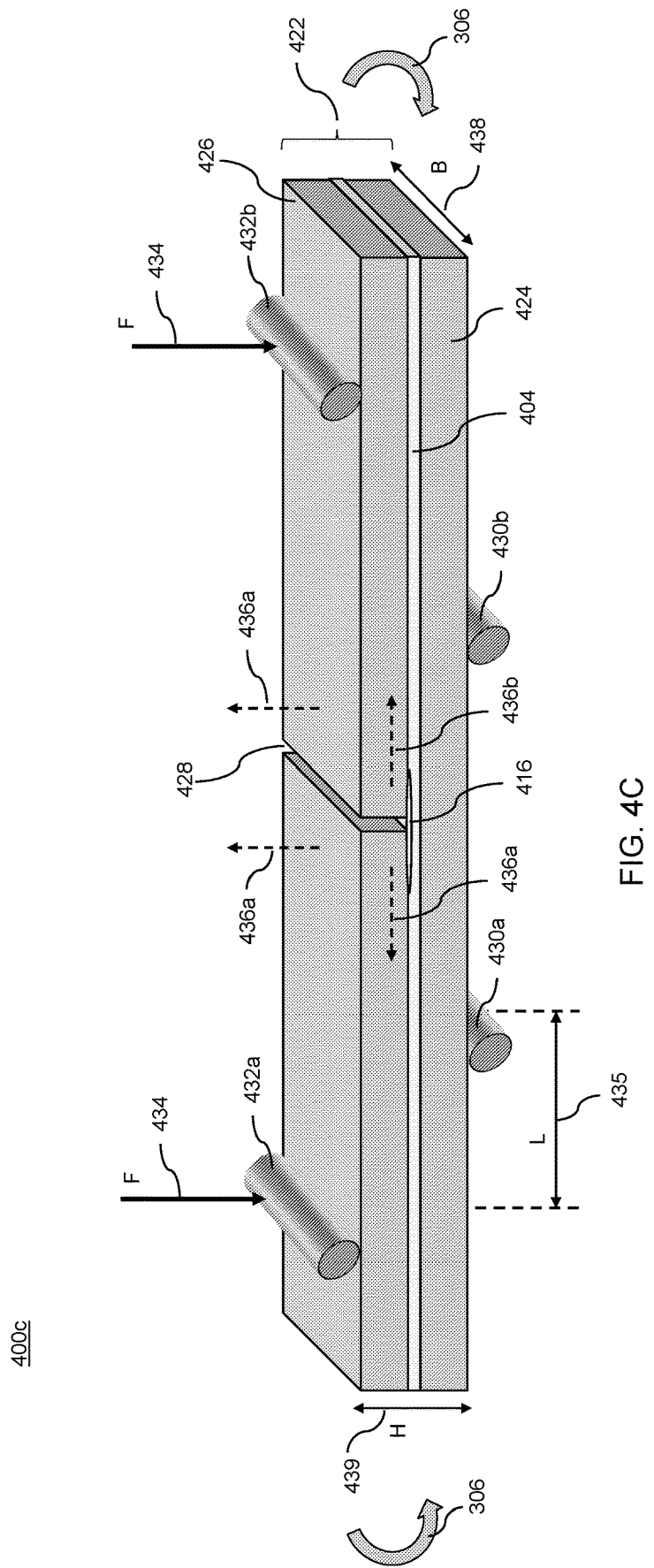
FIG. 4C is a perspective view of a third test apparatus that may be used to determine an interfacial bonding energy.

FIG. 4C is a perspective view of a third test apparatus 400*c* that may be used to determine an interfacial bonding energy. The third test apparatus 400*c* may include a sandwich structure 422 that may include a first substrate 424 bonded to a second substrate 426. As shown, the first substrate 424 and the second substrate 426 may each have a slab geometry with planar surfaces that are aligned parallel to one another. The first substrate 424 and the second substrate 426 may be bonded to one another with a first adhesive 404. In other embodiments, the first substrate 424 and the second substrate 426 may be bonded to one another with two or more adhesives (e.g., the first adhesive 404, the second adhesive 406, etc.). The sandwich structure 422 may include a notch 428 formed in the second substrate 426. In this example, the notch 428 is shown penetrating completely through the second substrate 426. In other example structure, the notch 428 may be configured to partially penetrate through the second substrate 426 or may has a depth less than a thickness of the second substrate 426.

The third test apparatus 400*c* may be configured to perform a 4PB test on the sandwich structure 422. In this regard, the third test apparatus 400*c* may include a first support pin 430*a* and a second support pin 430*b*. The sandwich structure 422 may be placed on the first support pin 430*a* and the second support pin 430*b* so that the first support pin 430*a* and the second support pin 430*b* mechanically support the sandwich structure 422. The third test apparatus 400*c* may further include a first forcing pin 432*a* and a second forcing pin 432*b*. The first forcing pin 432*a* and the second forcing pin 432*b* may each be configured to apply a third force 434 F. The application of the third force 434 F may generate bending moments 306 due to the fact that a given forcing pin (432*a*, 432*b*) may be laterally separated from a respective support pin (430*a*, 430*b*). In this example, each forcing pin (432*a*, 432*b*) may be laterally separated from a respective support pin (430*a*, 430*b*) by a separation distance 435 L.

The bending moments 306 may generate a mixed-mode stress distribution within the sandwich structure 422. In this regard, the induced stress distribution may include a tensile stress component 436*a* and a shear stress component 436*b*. As indicted in FIG. 4C, the tensile stress component 436*a* may be oriented perpendicular to the interface between the first substrate 424 and the second substrate 426. As such, the tensile stress component 436*a* may induce a corresponding tensile strain component that may act to displace the second substrate 426 relative to the first substrate 424 along a direction perpendicular to a plane of the interface. Similarly, the shear stress component 436*b* may induce a corresponding shear strain component that may act to displace the second substrate 426 relative to the first substrate 424 along a direction parallel to the interface. As such, both the tensile stress component 436*a* and the shear stress component 436*b* may initiate formation of an interface delamination (or crack) 416 if a threshold for delamination or crack formation is exceeded.

An interfacial bonding energy may be characterized by the fracture energy G (more precisely the strain energy release rate G) that may be determined by the following equation:

$$G = \frac{21 F_{cr}^2 L^2}{16 E B^2 H^3},$$

where $F_{cr}$ is a critical force for steady state crack propagation (e.g., see FIG. 7D and related description, below), L is the separation distance 435 between each forcing pin (432*a*, 432*b*) and a respective support pin (430*a*, 430*b*), E is the elastic modulus of the first substrate 424 and the second substrate 426, B is the width 438 of the sandwich structure 422, and H is the thickness 439 of the sandwich structure 422. The above equation is based on the theory of elastic beams and may be used to characterize an interfacial bonding energy as follows. As described in greater detail with reference to FIG. 7D, below, once an interface delamination or crack 416 is established, a force vs. displacement profile (i.e., the measured force and displacement of the forcing pins (432a, 42b)) may include a third portion 706 having an approximately constant value of force vs. displacement as the crack 416 propagates along the interface. The value $F_{cr}$ of the approximately constant third portion 706 of the force vs. displacement profile is the critical force for steady state crack propagation, mentioned above (and appearing the in the equation for G). Thus, the fracture energy G may be determined from the measured force vs. displacement profile (e.g., see FIG. 7D) without the need to measure a length of the crack 416.

The third test apparatus 400c may be used to determine fracture energies G of various interfaces subjected to mixed mode stresses. As described above with reference to FIG. 3A to 3F, for example, such mixed mode stresses may be similar to stresses experienced by realistic package structures under thermal cycling conditions. However, with decreasing sizes of semiconductor dies (104, 106), it may be difficult or impossible to perform a 4PB test on a structure that includes a single die sandwiched between two substrates (424, 426) using existing structures and techniques (e.g., the third test apparatus 400c of FIG. 4C. To remedy this situation, new interfacial bonding test structures (e.g., described below with reference to FIGS. 5A to 5E) may include a plurality of semiconductor dies (104a, 104b, etc.) sandwiched between a first substrate 424 and a second substrate 426. Such interfacial bonding test structures, when subjected to bending moments (e.g., see FIGS. 4C, 7A, 7B, and 7C) may be configured to initiate cracks at interfaces between semiconductor dies and substrates (424, 426). Initiation of such cracks may be difficult or impossible in an interfacial bonding test structure that only included a single semiconductor die 104 due to the relatively small size of the semiconductor die 104. Further, as with the example of FIG. 4C, bonding energies may be determined based on a measured critical force $F_{cr}$ needed for steady state crack propagation, without the need to measure a crack length, as described in greater detail with reference to FIGS. 7A to 7D, below.

Figure 5A:
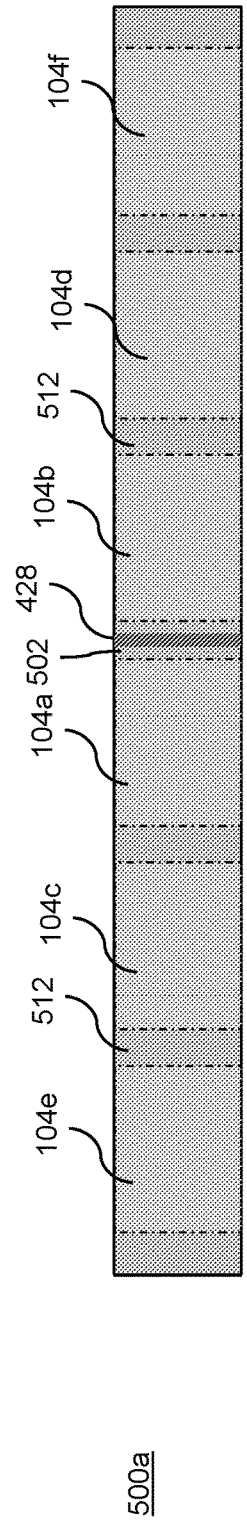
FIG. 5A is a top view of an interfacial bonding test structure, according to various embodiments.
Figure 5B:
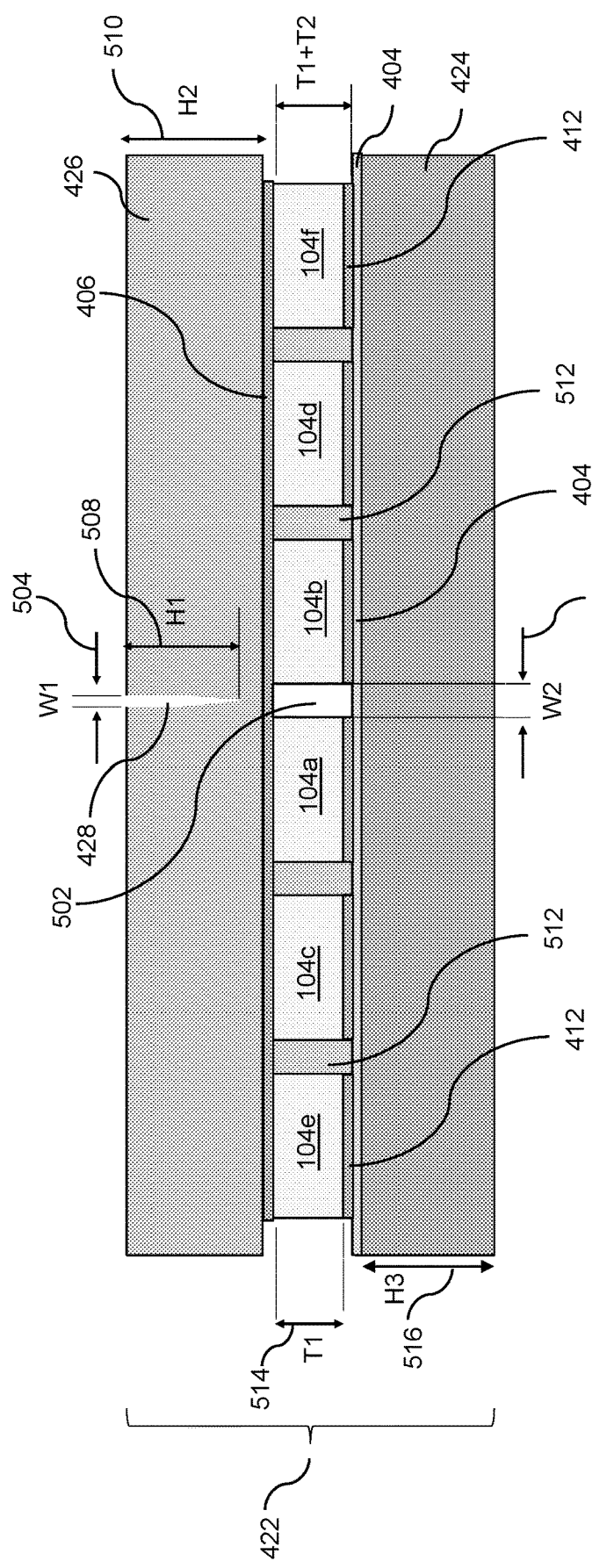
FIG. 5B is a vertical cross-sectional view of the interfacial bonding test structure of FIG. 5A, according to various embodiments.

FIG. 5A is a top view of an interfacial bonding test structure 500a, and FIG. 5B is a vertical cross-sectional view of the interfacial bonding test structure 500a of FIG. 5A, according to an embodiment. The interfacial bonding test structure 500a may include a first substrate 424 having a first planar surface and a second substrate 426 have a second planar surface that is parallel to the first planar surface. The interfacial bonding test structure 500a may further include a first semiconductor die 104a and a second semiconductor die 104b. The first semiconductor die 104a and the second semiconductor die 104b may each be located between the first substrate 424 and the second substrate 426 such that the first substrate 424, the second substrate 426, the first semiconductor die 104a, and the second semiconductor die 104b, form a sandwich structure 422. The first semiconductor die 104a and the second semiconductor die 104b may be bonded to the first substrate 424 with a first adhesive 404 and may be bonded to the second substrate 426 with a second adhesive 406.

Each of the first semiconductor die 104a and the second semiconductor die 104b my further include a third adhesive 412 formed between the semiconductor dies (104a, 104b) and the first adhesive 404. In example embodiments, the first adhesive 404 may be, for example, a first underfill material portion 122 and the second adhesive 406 may be an epoxy material such as may be used to form the multi-die EMC frame 202, described above. Various other adhesives may be used in other embodiments. Also, other embodiments may use a single adhesive (i.e., a common adhesive material) rather than the first adhesive 404 and the second adhesive 406.

The first semiconductor die 104a and the second semiconductor die 104b may be located adjacent to one another and may be laterally displaced from one another by a first separation 502 along a direction parallel to the first planar surface and the second planar surface as shown, for example, in FIG. 5B. Also, as shown in FIGS. 5A and 5B, the second substrate 426 may further include a notch 428 partially penetrating through a thickness of the second substrate 426. The notch 428 may have a first width 504 W1 and the first separation 502 may have a second width 506 W2. As shown, the first width W1 may have a value that is less than or equal to a value of the second width W2. As such, an area of the notch 428 may overlap with an area of the first separation 502 in a plan view as shown, for example, in FIG. 5A. In this regard, a ratio W1/W2 of the first width W1 to the second width W2 may satisfy 1>W1/W2>0.

The notch 428 may penetrate partially through the second substrate 426. For example, as shown in FIG. 5B, the notch 428 may have a first height 508 H1 that may be less than or equal to a second height 510 H2 (i.e., a thickness) of the second substrate 426. As such, a ratio H1/H2 of the first height H1 to the second height H2 may satisfy 1>H1/H2>=0.2. In this regard, a minimum size of the notch 428 may be given by H1=0.2*H2. Alternatively, the minimum size of the notch 428 may take on various other values in other embodiments. When H1=H2 the notch 428 may penetrate completely through the thickness of the second substrate 426, as was the case with the third test apparatus 400c of FIG. 4C, described above.

As shown, the interfacial bonding test structure 500a may further include two or more additional semiconductor dies (104c, 104d, 104e, 104f) located between the first substrate 424 and the second substrate 426. As with the first semiconductor die 104a and the second semiconductor die 104b, the additional semiconductor dies (104c, 104d, 104e, 104f) may be bonded to the first substrate 424 with the first adhesive 404 and bonded to the second substrate 426 with the second adhesive 406. Further, as shown in FIGS. 5A and 5B, the two or more additional semiconductor dies (104c, 104d, 104e, 104f) may be respectively located on opposite sides of the first separation 502 to thereby form an array of semiconductor dies (104a, 104b, 104c, 104d, 104e, 104f).

Each of the two or more additional semiconductor dies (104c, 104d, 104e, 104f) may be separated from one another by a certain distance that may be comparable to W2 (i.e., may have a value that is comparable to that of the first separation 502). In this way, a plurality of second separations 512 separating adjacent semiconductor dies may also be formed. For example, as shown in FIG. 5B, second separations 512 may be formed between semiconductor dies 104e and 104c, between semiconductor dies 104c and 104a, between semiconductor dies 104b and 104d, and between semiconductor dies 104d and 104f. In some embodiments, the second separations 512 may include a fourth adhesive while the first separation 502 may be left as an unfilled gap. In this way, the array of semiconductor dies (104a, 104b, 104c, 104d, 104e, 104f) may form two halves. The first half (e.g., on the left in FIG. 5B) may include the semiconductor dies 104e, 104c, and 104a, while the second half (e.g., on the right in FIG. 5B) may include the semiconductor dies 104b, 104d, and 104f.

The presence of the of the fourth adhesive may strengthen the first half (104e, 104c, 104a) of the array and the second half of the array (104*b*, 104*d*, and 104*f*). The absence of the fourth adhesive in the first separation 502, however, may causes interfaces near the first separation 502 (e.g., the interface between the first semiconductor die 104*a* and the second substrate 426 and the interface between the second semiconductor die 104*b* and the second substrate 426) to experience a greater stress concentration during a 4PB test (e.g., see FIGS. 7A to 7D) than interfaces farther away from the first separation 502 (e.g., the interface between the third semiconductor die 104*c* and the second substrate 426 and the interface between the fourth semiconductor die 104*c* and the second substrate 426, etc.).

As mentioned above, the interfacial bonding test structure 500*a* may be placed in a 4PB apparatus and may be subjected to bending moments 306 (e.g., see FIGS. 7A to 7C) as described above in the example of the third test apparatus 400*c* (e.g., see FIG. 4C and related description). The presence of the notch 428 may allow the second substrate 426 to be fractured, bent more and for an interface delamination 416 (e.g., see FIG. 7C) to develop at the interfaces near the first separation 502. The crack 416 may then propagate and a fracture energy G may be determined from the force vs. displacement profile (e.g., see FIG. 7D), as described above with reference to the extended interface of the third test apparatus 400*c* of FIG. 6. In contrast to the third test apparatus 400*c*, however, a 4PB test using the embodiment interfacial bonding test structures (e.g., see FIGS. 5A to 5F) may allow determination of fracture energies G for realistic semiconductor dies (104*a*, 104*b*, 104*c*, 104*d*, 104*e*, 104*f*) bonded to substrates (424, 426).

As further shown in FIG. 5B, the interfacial bonding test structure 500*a* may include semiconductor dies (104*a*, 104*b*, 104*c*, 104*d*, 104*e*, 104*f*) having a first thickness 514 T1. The third adhesive 412 may have a second thickness T2 such that a ratio T1/(T1+T2) of the first thickness T1 to the sum of the first thickness T1 and the second thickness T2 satisfies 1>T1/(T1+T2)>0. In other words, the third adhesive 412 may be extremely thin (i.e., T1/(T1+T2)≈1) or the third adhesive 412 may be as thick as the semiconductor dies (104*a*, 104*b*, 104*c*, 104*d*, 104*e*, 104*f*) (i.e., T1/(T1+T2)≈0.5) or greater. As mentioned above, the second substrate 426 may have a second height 510 H2. Similarly, the first substrate 424 may have a third height 516 H3. The third height 516 H3 may be similar to the second height 510 H2. Further, to simplify the analysis used to determine the fracture energy G (e.g., see equation for G, above) the second height 510 H2 and the third height 516 H3 may be chosen to be greater than sum T1+T1 of the first thickness T1 and the second thickness T2.

In some embodiments, the second adhesive 406 may be chosen to be stronger than the first adhesive 404. In other embodiments the first adhesive 404 and the second adhesive 406 may be the same material. As mentioned above, some embodiments may include a third adhesive 412 in addition to the first adhesive 404 and the second adhesive 406. Each of the first adhesive 404, the second adhesive 406, and the third adhesive 412 may be dissimilar materials. Alternatively, two or more of the first adhesive 404, the second adhesive 406, and the third adhesive 412 may include a common material. Further, the first substrate 424 and the second substrate 426 may share a common material, or in other embodiments, the first substrate 424 and the second substrate 426 may be dissimilar materials. For example, the first substrate 424 and the second substrate 426 may include a semiconductor material such as silicon, silicon on insulator (SOI), etc.

Figure 5C:
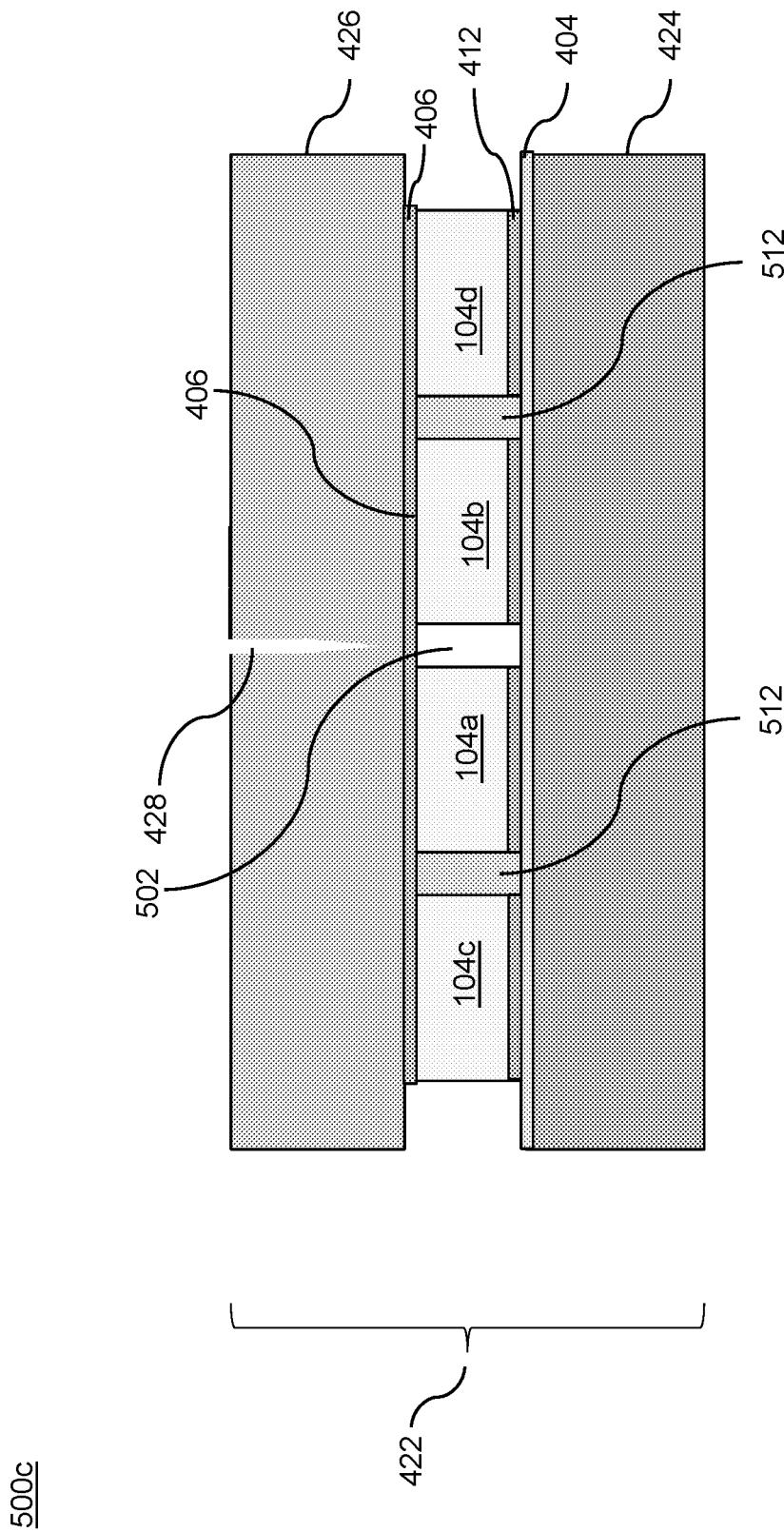
FIG. 5C is a vertical cross-sectional view of a further interfacial bonding test structure, according to various embodiments.
Figure 5D:
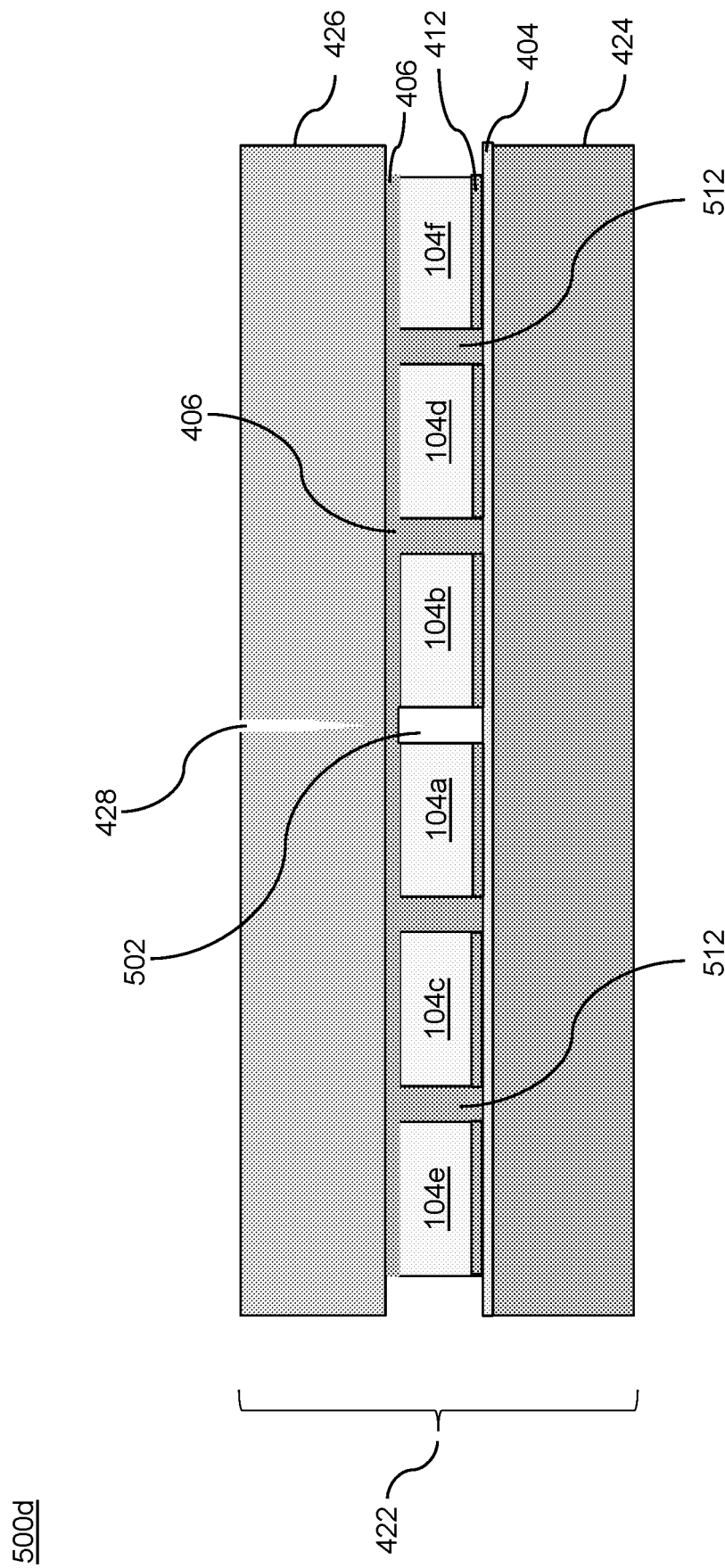
FIG. 5D is a vertical cross-sectional view of a further interfacial bonding test structure, according to various embodiments.
Figure 5E:
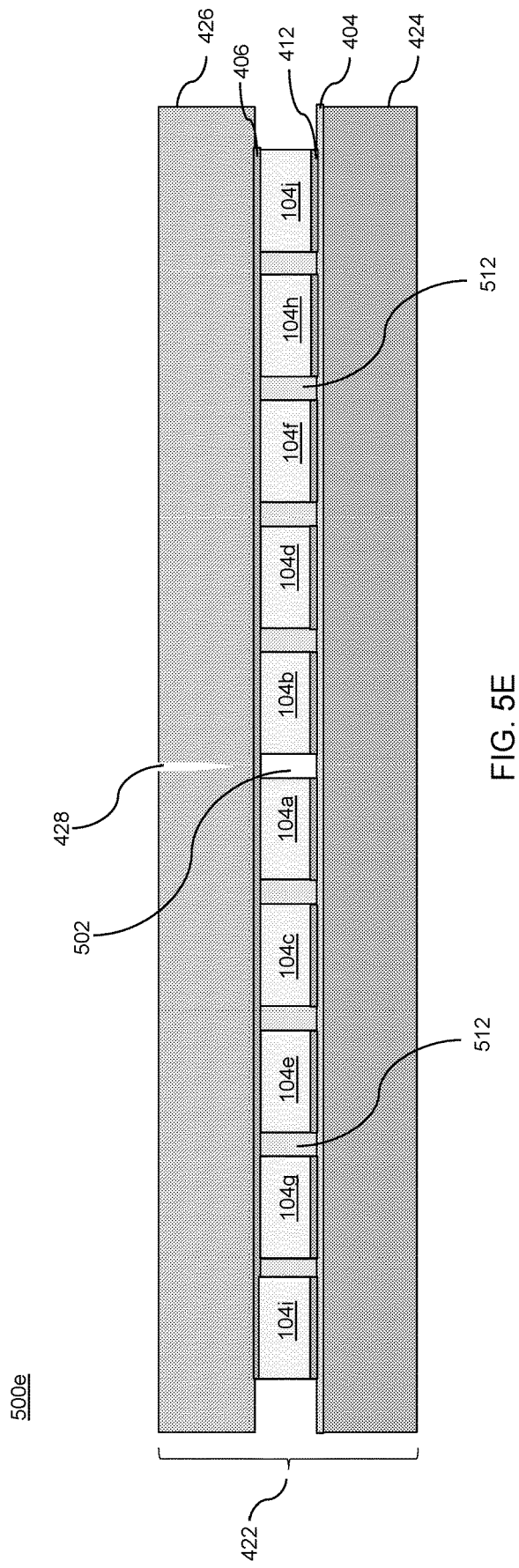
FIG. 5E is a vertical cross-sectional view of a further interfacial bonding test structure, according to various embodiments.

FIGS. 5C, 5D, and 5E are vertical cross-sectional views of further interfacial bonding test structures 500*c*, 500*d*, and 500*e*, respectively, according to various embodiments. Each of the interfacial bonding test structures 500*c*, 500*d*, and 500*e* may be similar to the interfacial bonding test structure 500*a* of FIGS. 5A and 5B. In this regard, the interfacial bonding test structures 500*c*, 500*d*, and 500*e* may each include a first substrate 424, a second substrate 426, a first a first semiconductor die 104*a* and a second semiconductor die 104*b* each located between, and bonded to, the first substrate 424 and the second substrate 426 such that the first substrate 424, the second substrate 426, the first semiconductor die 104*a*, and the second semiconductor die 104*b* form a sandwich structure 422. The first semiconductor die 104*a* and the second semiconductor die 104*b* may be bonded to the first surface of the first substrate 424 with a first adhesive 404 and may be bonded to the second surface of the second substrate 426 with a second adhesive 406.

The each of the first semiconductor die 104*a* and the second semiconductor die 104*b* my further include a third adhesive 412 formed between the semiconductor dies (104*a*, 104*b*) and the first adhesive 404. In example embodiments, the first adhesive 404 may be, for example, a first underfill material portion 122 and the second adhesive 406 may be an epoxy material such as may be used to form the multi-die EMC frame 202, described above. Various other adhesives may be used in other embodiments. Also, other embodiments may use a single adhesive (i.e., a common adhesive material) rather than the first adhesive 404 and the second adhesive 406.

The first semiconductor die 104*a* and the second semiconductor die 104*b* may be located adjacent to one another and may be laterally displaced from one another by a first separation 502 along a direction parallel to the first planar surface and the second planar surface as shown, for example, in FIGS. 5C, 5D, and 5E. Also, as shown in FIGS. 5C, 5D, and 5E, the second substrate 426 may further include a notch 428 partially penetrating through a thickness of the second substrate 426. As shown, the interfacial bonding test structures 500*c*, 500*d*, and 500*e* may further include two or more additional semiconductor dies located between the first substrate 424 and the second substrate 426. In this regard, the interfacial bonding test structure 500*c* of FIG. 5C includes additional semiconductor dies (104*c*, 104*d*), interfacial bonding test structure 500*d* of FIG. 5D includes additional semiconductor dies (104*c*, 104*d*, 104*e*, 104*f*), and the interfacial bonding test structure 500*e* of FIG. 5C includes semiconductor dies (104*c*, 104*d*, 104*e*, 104*f*, 104*g*, 104*h*, 104*i*, 104*j*).

As with the first semiconductor die 104*a* and the second semiconductor die 104*b*, the additional semiconductor dies (104*c*, 104*d*, etc.) may be bonded to the first substrate 424 with the first adhesive 404 and bonded to the second substrate 426 with the second adhesive 406. Further, as shown in FIGS. 5C to 5E, the two or more additional semiconductor dies may be respectively located on opposite sides of the first separation 502 to thereby form an array of semiconductor dies. Further, as shown in each of FIGS. 5C to 5E, the array of semiconductor dies may include an even number of semiconductor dies that is greater than or equal to 2.

As with the embodiment of FIGS. 5A and 5B, each of the two or more additional semiconductor dies (104*c*, 104*d*, etc.) may be separated from one another by a certain distance that may be comparable to W2 (i.e., may have a value that is comparable to that of the first separation 502; see FIG. 5B). In this way, a plurality of second separations 512 separating adjacent semiconductor dies may also be formed. In some embodiments, the second separations 512 may include a fourth adhesive while the first separation 502 may be left as an unfilled gap. In other embodiments, such as the interfacial bonding test structure 500d of FIG. 5D, a single adhesive 406 may be used to fill the second separations 512 as well as to bond the semiconductor dies to the second substrate 426.

Figure 6A:
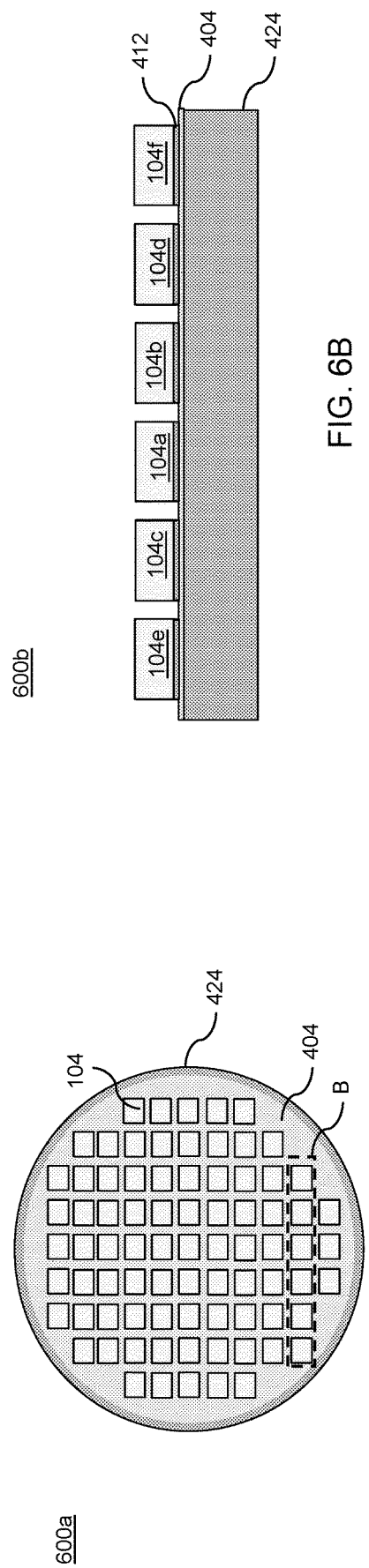
FIG. 6A is a top view of an intermediate structure that may be used to form an interfacial bonding test structure, according to an embodiment.

FIGS. 6A to 6F are various views of respective intermediate structures 600a to 600e that may be used to form an interfacial bonding test structure 600f, according to various embodiments. In this regard, FIG. 6A is a top view of a reconstituted wafer including a first substrate 424 having a plurality of semiconductor dies 104 bonded to the first substrate 424 using a first adhesive 404. as shown, the first substrate 424 may have a planar surface to which the semiconductor dies 104 may be bonded. The semiconductor dies 104 may first be formed on a fabrication wafer (not shown) using integrated circuit fabrication techniques to form transistors, capacitors, resistors, etc., configured as integrated circuits. The fabrication wafer may then be diced (i.e., singulated) to form separate semiconductor dies 104. Using a pick and place technique, the semiconductor dies 104 may then be individually placed on the first substrate 424 and may be bonded to the first substrate 424 using a first adhesive 404. As mentioned above, the first adhesive 404 may be an epoxy molding compound or other adhesive. In this way, first sides of two or more semiconductor dies (104a, 104b, etc.) may be bonded to a first substrate having a planar surface.

Figure 6B:
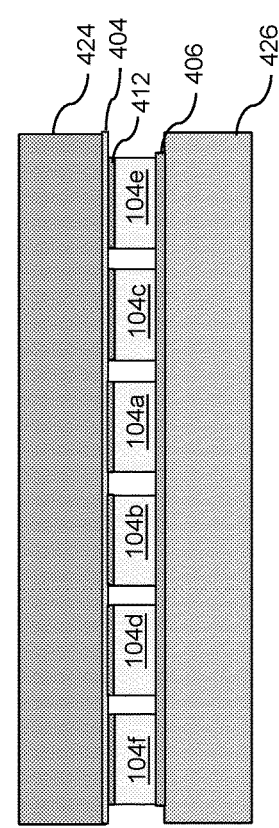
FIG. 6B is a vertical cross-sectional view of a further intermediate structure that may be used to form an interfacial bonding test structure, according to an embodiment.

FIG. 6B is a vertical cross-sectional view of a further intermediate structure 600b that may be used to form an interfacial bonding test structure 600f, according to an embodiment. The intermediate structure 600b may be formed from the intermediate structure 600a of FIG. 6A by dicing the reconstituted wafer along the dashed lines (labeled B) shown in FIG. 6A. In other embodiments, the reconstituted wafer may be diced in various other ways generate intermediate structures having different numbers of semiconductor dies 104 that may be used for forming other interfacial bonding test structures having respective numbers of semiconductor dies 104 (e.g., see FIGS. 5A to 5E).

Figure 6C:
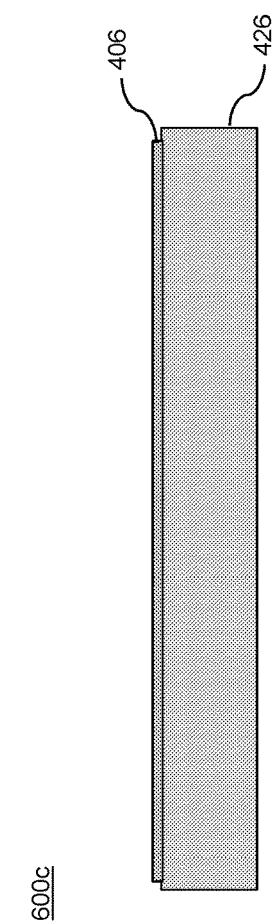
FIG. 6C is a vertical cross-sectional view of a further intermediate structure that may be used to form an interfacial bonding test structure, according to an embodiment.
Figure 6D:
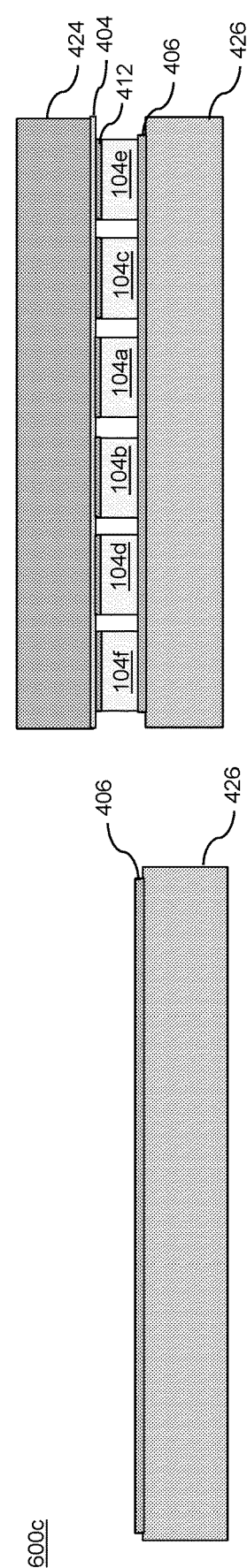
FIG. 6D is a vertical cross-sectional view of a further intermediate structure that may be used to form an interfacial bonding test structure, according to an embodiment.

FIG. 6C is a vertical cross-sectional view of a further intermediate structure 600c that may be used to form an interfacial bonding test structure 600f, according to an embodiment. The intermediate structure 600c may be formed by forming a coating of a second adhesive 406 on a surface of a second substrate 426. As described above, the second substrate 426 may be a semiconductor substrate such as a silicon substrate, silicon on insulator substrate, etc., and may have a planar surface. After applying the second adhesive 406, the second substrate 426 may be bonded to the two or more semiconductor dies such that the first substrate, the second substrate, and the two or more semiconductor dies form a sandwich structure (i.e., the intermediate structure 600e), as shown in FIG. 6D. In this way, second sides of two or more semiconductor dies (104a, 104b, etc.) may be bonded to the second substrate 426 having a planar surface.

Figure 6F:
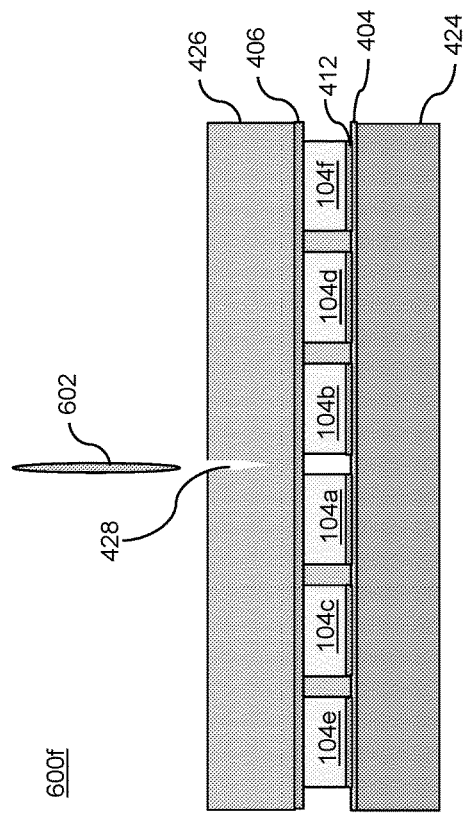
FIG. 6F is a vertical cross-sectional view of an interfacial bonding test structure, according to an embodiment.
Figure 6E:
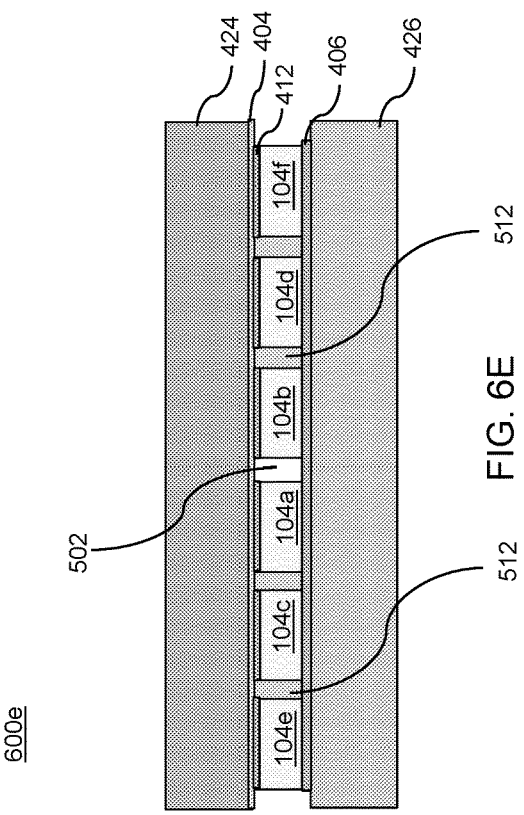
FIG. 6E is a vertical cross-sectional view of a further intermediate structure that may be used to form an interfacial bonding test structure, according to an embodiment.

FIG. 6E is a vertical cross-sectional view of a further intermediate structure 600e that may be used to form an interfacial bonding test structure 600f, according to an embodiment. The intermediate structure 600e may be formed from the intermediate structure 600d of FIG. 6D by forming a fourth adhesive material in gaps formed within the second separations 512, while leaving the first separation 502 empty, as described above. Various materials may be used for the fourth adhesive. For example, the fourth adhesive may be an epoxy molding compound, an underfill material, etc. In a further operation, a dicing saw 602 may be used to form a notch 428 in the second substrate 426, as shown in FIG. 6F. The resulting interfacial bonding test structure 600f may be similar to the interfacial bonding test structure 500a of FIGS. 5A and 5B. In this regard, the notch 428 may be formed such that it partially penetrates through a thickness of the second substrate 426 (e.g., see FIG. 5B and related description, above). Each of the embodiment interfacial bonding test structures 500a, 500c, 500d, 500e, of FIGS. 5A to 5D may be constructed using methods similar to those described above with reference to FIGS. 6A to 6F.

FIGS. 7A to 7C are vertical cross-sectional views of an interfacial bonding test structure in various configurations during a 4PB test, and FIG. 7D illustrates an example force vs. displacement profile that may be generated by a 4PB test, according to various embodiments. The interfacial bonding test structure may be similar to the interfacial bonding test structure 500a of FIGS. 5A and 5B. In this regard, the interfacial bonding test structure of FIGS. 7A to 7C may include a plurality of semiconductor dies (104a, 104b, 104c, 104d, 104e, 104f) located between the first substrate 424 and the second substrate 424 such that the first substrate 424, the second substrate 426, the first semiconductor die 104a, and the second semiconductor die 104b form a sandwich structure. As shown, the interfacial bonding test structure may be placed in a 4PB apparatus and may be supported by support pins (430a, 430b).

The 4PB apparatus may further include forcing pins (432a, 432b) which may then be activated to apply a force 434 to thereby generate bending moments 306. The forcing pins (432a, 432b) may be configured to impose a predetermined displacement vs. time to the interfacial bonding test structure. For example, the forcing pins (432a, 432b) may be actuated by a screw mechanism that causes the forcing pins (432a, 432b) have a displacement that increases at a certain predetermined rate. The force exerted by the forcing pins (432a, 432b) may be measured as the forcing pins (432a, 432b) are moved. For example, the forcing pins may be connected to a spring-loaded mechanism that exerts a predetermined force vs. spring-compression distance. Thus, a force imposed by the spring-loaded mechanism may be measured by measuring a spring-compression distance. Thus, a force exerted by the forcing pins (432a, 432b) may be determined for each value of the displacement of the forcing pins (432a, 432b).

FIG. 7D illustrates an example force vs. displacement profile that may be generated by a 4PB test, according to various embodiments. In this example, a measured force may be indicated by the vertical axis and the corresponding displacement may be indicated by the horizontal axis in FIG. 7D. As shown, the measured force vs. displacement may have three characteristic curves including a first portion 702, a second portion 704, and a third portion 706. The first portion 702 of the force vs. displacement profile in FIG. 7D may correspond to the interfacial bonding test structure in a first configuration during a 4PB test, as illustrated in FIG. 7A. In this configuration, the interfacial bonding test structure may be in a state of elastic deformation such that the force vs. displacement curve may increase relatively slowly (i.e., may have a small slope). With increased deformation, however, the interfacial bonding test structure may undergo plastic deformation (depending on the materials used for the first substrate 424 and the second substrate 426) followed by fracture of the second substrate 426 as shown, for example, in FIG. 7B. The presence of the notch 428 may facilitate the initiation of fracture in the second substrate 426. In this configuration, as shown in FIG. 7B, a fracture 701 (i.e., a crack) may propagate through the second substrate 426. The corresponding second portion 704 of the force vs. displacement profile may characterize this phase of deformation.

Following fracture of the second substrate 426 a larger stress concentration may be generated at interfaces near the first separation 502, as described above. The stress concentration at these interfaces may lead to nucleation of an interfacial crack 416 between one or more of the semiconductor dies (e.g., semiconductor dies (104a, 104b)) and the second substrate 426, as shown in FIG. 7C. After nucleation, the interfacial crack 416 may be propagated in response to application of a relatively constant force $F_c r$, as indicated in the third portion 706 of the force vs. displacement profile in FIG. 7D. The spike 708 in the force vs. displacement profile may correspond to a threshold stress concentration factor required to nucleate the interfacial crack 416. As described above with reference to FIG. 4C, the interfacial bonding energy may be determined based on the critical force $F_{cr}$ along with other parameters of the system including the separation distance 435 L (e.g., see FIG. 4C) between each forcing pin (432a, 432b) and a respective support pin (430a, 430b), the elastic modulus E of the first substrate 424 and the second substrate 426, the width 438 B of the sandwich structure 422, and the thickness H of the sandwich structure 422 (e.g., see FIG. 4C and related description, above).

Figure 8:
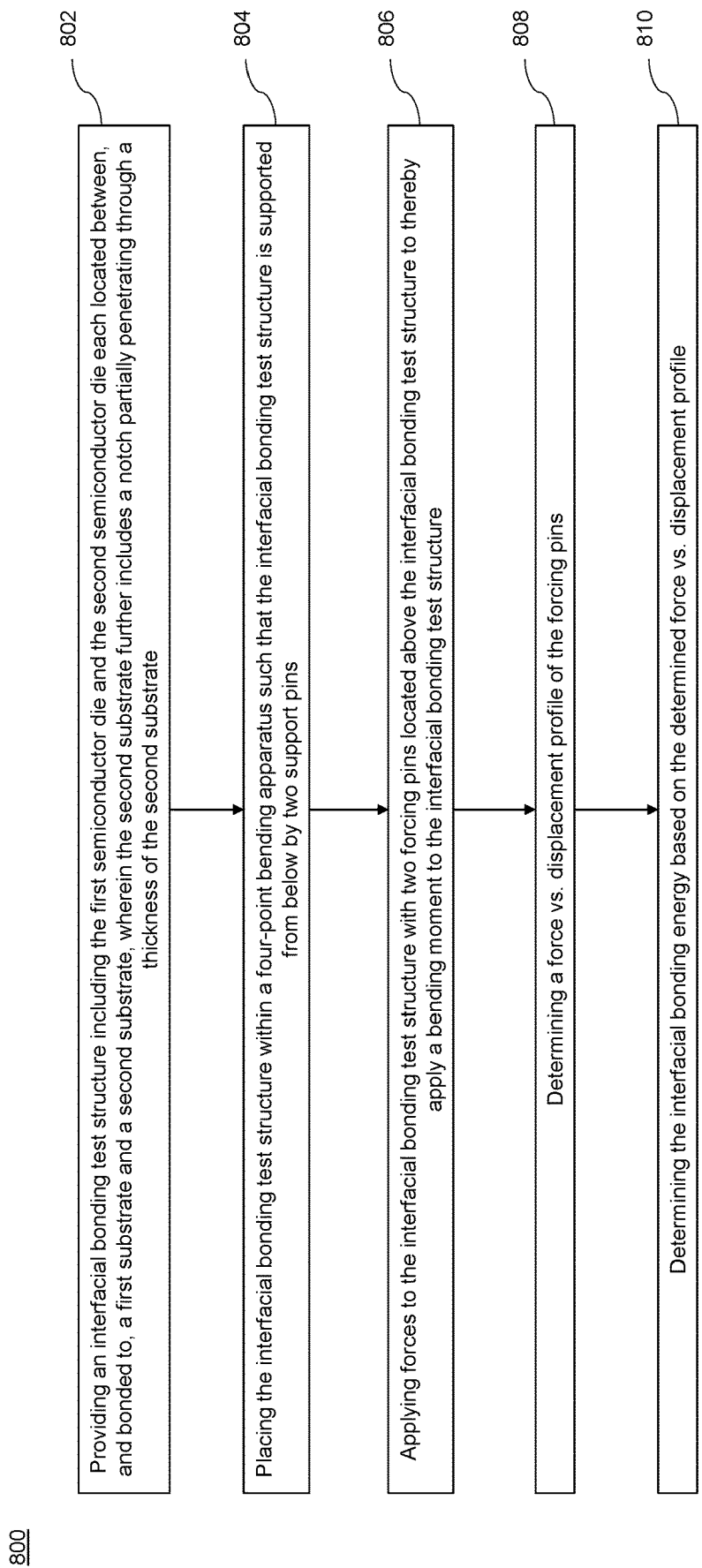
FIG. 8 is a flowchart illustrating various operation of a method of determining an interfacial bonding energy of a first semiconductor die and a second semiconductor bonded to a first substrate, according to various embodiments.

FIG. 8 is a flowchart illustrating various operation of a method 800 of determining an interfacial bonding energy of a first semiconductor die 104a and a second semiconductor die 104b bonded to a first substrate 424 and a second substrate 426, according to various embodiments. In operation 802, the method 800 may include providing an interfacial bonding test structure (500a, 500c, 500d, 500e) including the first semiconductor die 104a and the second semiconductor die 104b each located between, and bonded to, the first substrate 424 and the second substrate 426. As described above, the second substrate 426 may further include a notch 428 partially penetrating through a thickness of the second substrate 426.

In operation 804, the method 800 may further include placing the interfacial bonding test structure (500a, 500c, 500d, 500e) within a four-point bending apparatus (e.g., see FIGS. 4C, 7A, 7B, and 7C) such that the interfacial bonding test structure (500a, 500c, 500d, 500e) is supported from below by two support pins (430a, 430b). In operation 806, the method 800 may include applying forces 434 F to the interfacial bonding test structure (500a, 500c, 500d, 500e) with two forcing pins (432a, 432b) located above the interfacial bonding test structure (500a, 500c, 500d, 500e) to thereby apply a bending moment 306 to the interfacial bonding test structure (500a, 500c, 500d, 500e). In operation 808, the method 800 may include determining a force vs. displacement profile (e.g., see FIG. 7D) of the forcing pins (432a, 432b), and in operation 810, the method 800 may include determining the interfacial bonding energy G based on the determined force vs. displacement profile. In this regard, the interfacial bonding energy G may be determined once the critical force Fcr (e.g., see FIG. 7D) has been determined.

The method 800 may further include increasing the displacement of the forcing pins (432a, 432b) relative to the support pins (430a, 430b) such that a first crack 701 in the second substrate 426 forms from the notch 428 and propagates through the second substrate (e.g., see FIGS. 7B and 7D). The method 800 may further include further increasing the displacement of the forcing pins (432a, 432b) relative to the support pins (430a, 430b) such that a second crack 416 forms at an interface between the first semiconductor die 104a and the second substrate 426, and between the second semiconductor die 104b and the second substrate 426 (e.g., see FIG. 7C).

The method 800 may further include further increasing the displacement of the forcing pins (432a, 432b) relative to the support pins (430a, 430b) such that the second crack 416 propagates relative interface (e.g., see FIGS. 7C and 7D). Determining the force vs. displacement profile (e.g., see FIG. 7D) of the interfacial bonding test structure may further include determining an approximately constant force vs. displacement portion 706 of the force vs. displacement profile corresponding to propagation of the second crack 416. Determining the interfacial bonding energy may further include determining the interfacial bonding energy G based on the value of the constant force $F_c r$ of the constant force vs. displacement portion 706 of the force vs. displacement profile (e.g., see FIG. 7D).

Referring to all drawings and according to various embodiments of the present disclosure, an interfacial bonding test structure (500a, 500c, 500d, 500e) (see FIGS. 5A to 5E) is provided. The interfacial bonding test structure (500a, 500c, 500d, 500e) may include a first substrate 424 having a first planar surface; a second substrate 426 having a second planar surface that is parallel to the first planar surface 424. The interfacial bonding test structure (500a, 500c, 500d, 500e) may further include a first semiconductor die 104a and a second semiconductor die 104b each located between the first substrate 424 and the second substrate 426 such that the first substrate 424, the second substrate 426, the first semiconductor die 104a, and the second semiconductor die 104b, form a sandwich structure 422, wherein the first semiconductor die 104a and the second semiconductor die 104b may be located adjacent to one another and are laterally displaced from one another by a first separation along a direction parallel to the first planar surface and the second planar surface. The interfacial bonding test structure (500a, 500c, 500d, 500e) may further include a first adhesive 404 that bonds the first semiconductor die 104a and the second semiconductor die 104b to the first surface of the first substrate 424. The interfacial bonding test structure (500a, 500c, 500d, 500e) may further include a second adhesive 406 that bonds the first semiconductor die 104a and the second semiconductor die 104b to the second substrate 426. The interfacial bonding test structure (500a, 500c, 500d, 500e) may further include a notch 428 formed in the second substrate 426, wherein the notch 428 extends into the second substrate 426 such that an area of the notch 428 is overlapping with an area of the first separation 502 in a plan view.

In other embodiments, various other adhesives may be used. For example, the each of the first semiconductor die 104a and the second semiconductor die 104b my further include a third adhesive 412 formed between the semiconductor dies (104a, 104b) and the first adhesive 404. In example embodiments, the first adhesive 404 may be, for example, a first underfill material portion 122 and the second adhesive 406 may be an epoxy material such as may be used to form the multi-die EMC frame 202, described above. Various other adhesives may be used in other embodiments. Also, other embodiments may use a single adhesive (i.e., a common adhesive material) rather than the first adhesive 404 and the second adhesive 406.

The first semiconductor die 104a and the second semiconductor die 104b may be located adjacent to one another and may be laterally displaced from one another by a first separation 502 along a direction parallel to the first planar surface and the second planar surface as shown, for example, in FIG. 5B. Also, as shown in FIGS. 5A and 5B, the second substrate 426 may further include a notch 428 partially penetrating through a thickness of the second substrate 426. The notch 428 may have a first width 504 W1 and the first separation 502 may have a second width 506 W2. As shown, the first width W1 may have a value that is less than or equal to a value of the second width W2. As such, an area of the notch 428 may overlap with an area of the first separation 502 in a plan view as shown, for example, in FIG. 5A. In this regard, a ratio W1/W2 of the first width W1 to the second width W2 may satisfy 1>W1/W2>0.

The notch 428 may penetrate partially through the second substrate 426. For example, as shown in FIG. 5B, the notch 428 may have a first height 508 H1 that may be less than or equal to a second height 510 H2 (i.e., a thickness) of the second substrate 426. As such, a ratio H1/H2 of the first height H1 to the second height H2 satisfies 1>H1/H2>=0.2. In this regard, a minimum size of the notch 428 may be given by H1=0.2*H2. Alternatively, the minimum depth of the notch 428 may take on various other values in other embodiments.

As further shown in FIG. 5B, the interfacial bonding test structure 500a may include semiconductor dies (104a, 104b, 104c, 104d, 104e, 104f) having a first thickness 514 T1. The first adhesive 404 may have a second thickness T2 such that a ratio T1/(T1+T2) of the first thickness T1 to the sum of the first thickness T1 and the second thickness T2 satisfies 1>T1/(T1+T2)>0.

In some embodiments, the second adhesive 406 may be chosen to be stronger than the first adhesive 404. In other embodiments the first adhesive 404 and the second adhesive 406 may be the same material. As mentioned above, some embodiments may include a third adhesive 412 in addition to the first adhesive 404 and the second adhesive 406. Each of the first adhesive 404, the second adhesive 406, and the third adhesive 412 may be dissimilar materials. Alternatively, two or more of the first adhesive 404, the second adhesive 406, and the third adhesive 412 may include a common material. Further, the first substrate 424 and the second substrate 426 may share a common material, or in other embodiments, the first substrate 424 and the second substrate 426 may be dissimilar materials. For example, the first substrate 424 and the second substrate 426 may include a semiconductor material such as silicon, silicon on insulator (SOI), etc.

As mentioned above, the second substrate 426 have a second height 510 H2. Similarly, the first substrate 424 may have a third height 516 H3. The third height 516 H3 may be similar to the second height 510 H2. Further, the second height 510 H2 and the third height 516 H3 may be chosen to be greater than sum T1+T1 of the first thickness T1 and the second thickness T2.

As shown, the interfacial bonding test structure (500a, 500c, 500d, 500e) may further include two or more additional semiconductor dies (104c, 104d, 104e, 104f) located between the first substrate 424 and the second substrate 426. As with the first semiconductor die 104a and the second semiconductor die 104b, the additional semiconductor dies (104c, 104d, 104e, 104f) may be bonded to the first substrate 424 with the first adhesive 404 and bonded to the second substrate 426 with the second adhesive 406. Further, as shown in FIGS. 5, the two or more additional semiconductor dies (104c, 104d, 104e, 104f) may be respectively located on opposite sides of the first separation 502 to thereby form an array of semiconductor dies (104a, 104b, 104c, 104d, 104e, 104f). Each of the two or more additional semiconductor dies (104c, 104d, 104e, 104f) may be separated from one another by a certain distance that may be comparable to W2. In this way, a plurality of second separations 512 separating adjacent semiconductor dies may also be formed. In some embodiments, the second separations 512 may include a fourth adhesive while the first separation 502 may be left as an unfilled gap. Further, as shown in each of FIGS. 5A to 5E, the array of semiconductor dies may include an even number of semiconductor dies that is greater than or equal to 2.

The embodiment interfacial bonding test structures may provide advantages in that such interfacial bonding test structures may allow determination of bonding energies for circuit components (e.g., the semiconductor dies) that may otherwise be too small to be tested using existing test structures and methods. In this regard, an interfacial bonding test structure is provided that includes a plurality of semiconductor dies bonded between a first substrate and a second substrate such that the semiconductor dies, the first substrate, and the second substrate form a sandwich structure. The interfacial bonding test structure may be placed in a 4PB test apparatus and may be subjected to bending moments. An interfacial bonding energy may be determined based on a critical force that is required to generate steady-state interfacial crack propagation.

The foregoing outlines features of several embodiments so that those skilled in the art may better understand the aspects of the present disclosure. Those skilled in the art should appreciate that they may readily use the present disclosure as a basis for designing or modifying other processes and structures for achieving the same purposes and/or the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interfacial bonding test structure, comprising:
   a first substrate having a first planar surface;
   a second substrate have a second planar surface that is parallel to the first planar surface;
   a first semiconductor die and a second semiconductor die each located between the first substrate and the second substrate such that the first substrate, the second substrate, the first semiconductor die, and the second semiconductor die, form a sandwich structure, wherein the first semiconductor die and the second semiconductor die are located adjacent to one another and are laterally displaced from one another by a first separation along a direction parallel to the first planar surface and the second planar surface;
   a first adhesive that bonds the first semiconductor die and the second semiconductor die to the first substrate;
   a second adhesive that that bonds the first semiconductor die and the second semiconductor die to the second substrate; and
   a notch formed in the second substrate, wherein the notch extends into the second substrate such that an area of the notch is overlapping with an area of the first separation in a plan view.

2. The interfacial bonding test structure of claim 1, wherein the notch comprises a first width W1 and the first separation comprises a second width W2 such that a ratio W1/W2 of the first width W1 to the second width W2 satisfies 1>W1/W2>0.

3. The interfacial bonding test structure of claim 1, wherein the notch comprises a first height H1 and the second substrate comprises a second height H2 such that a ratio H1/H2 of the first height H1 to the second height H2 satisfies 1>H1/H2>=0.2.

4. The interfacial bonding test structure of claim 1, wherein the first semiconductor die and the second semiconductor die each comprise a first thickness T1 and the first adhesive comprises a second thickness T2 such that a ratio T1/(T1+T2) of the first thickness T1 to a sum of the first thickness T1 and the second thickness T2 satisfies 1>T1/(T1+T2)>0.

5. The interfacial bonding test structure of claim 1, wherein the second adhesive is stronger than the first adhesive.

6. The interfacial bonding test structure of claim 1, wherein the first substrate and the second substrate comprise a common material.

7. The interfacial bonding test structure of claim 6, wherein the first substrate and the second substrate comprise silicon.

8. The interfacial bonding test structure of claim 1, wherein the first substrate and the second substrate each comprise a thickness that is greater than a thickness of the first semiconductor die and the second semiconductor die.

9. The interfacial bonding test structure of claim 1, further comprising:
  two or more additional semiconductor dies located between the first substrate and the second substrate and bonded to the first substrate with the first adhesive and bonded to the second substrate with the second adhesive,
  wherein the two or more additional semiconductor dies are respectively located on opposite sides of the first separation to thereby form an array of semiconductor dies.

10. The interfacial bonding test structure of claim 9, wherein the array of semiconductor dies further comprises:
  a plurality of second separations separating adjacent semiconductor dies; and
  a third adhesive formed in each of the plurality of second separations.

11. The interfacial bonding test structure of claim 10, wherein two or more of the first adhesive, the second adhesive, and the third adhesive comprise a common material.

12. The interfacial bonding test structure of claim 9, wherein the array of semiconductor dies comprises an even number of semiconductor dies that is greater than or equal to 2.

13. A method of forming an interfacial bonding test structure, comprising:
  bonding first sides of two or more semiconductor dies to a first substrate having a planar surface;
  bonding a second substrate having a planar surface to second sides of the two or more semiconductor dies such that the first substrate, the second substrate, and the two or more semiconductor dies, form a sandwich structure; and
  forming a notch in the second substrate that partially penetrates through a thickness of the second substrate,
  wherein bonding the first sides of two or more semiconductor dies to the first substrate further comprises locating the two or more semiconductor dies such that a first a first separation laterally separates a first semiconductor die and a second semiconductor die, and
  wherein forming the notch further comprises locating the notch such that an area of the notch is overlapping with an area of the first separation in a plan view.

14. The method of claim 13, wherein bonding first sides of the two or more semiconductor dies to the first substrate further comprises forming a first adhesive between the first sides of the two or more semiconductor dies and the first substrate, and
  wherein bonding the second substrate to the second sides of the two or more semiconductor dies further comprises forming a second adhesive between the second sides of the two or more semiconductor dies and the second substrate.

15. The method of claim 13, further comprising bonding four or more semiconductor dies to the first substrate and the second substrate such that two or more second separations are formed between adjacent semiconductor dies; and
  forming a fourth adhesive in the two or more second separations.

16. The method of claim 13, wherein forming the notch further comprises forming the notch to have a width that is less than or equal to a width of the first separation.

17. A method of determining an interfacial bonding energy of a first semiconductor die and a second semiconductor die bonded to a first substrate and a second substrate, comprising:
  providing an interfacial bonding test structure comprising the first semiconductor die and the second semiconductor die each located between, and bonded to, the first substrate and the second substrate, wherein the second substrate further comprises a notch partially penetrating through a thickness of the second substrate;
  placing the interfacial bonding test structure within a four-point bending apparatus such that the interfacial bonding test structure is supported from below by two support pins;
  applying forces to the interfacial bonding test structure with two forcing pins located above the interfacial bonding test structure to thereby apply a bending moment to the interfacial bonding test structure;
  determining a force vs. displacement profile of the two forcing pins; and
  determining the interfacial bonding energy based on the force vs. displacement profile.

18. The method of claim 17, further comprising increasing a displacement of the two forcing pins relative to the two support pins such that a first crack in the second substrate forms from the notch and propagates through the second substrate.

19. The method of claim 18, further comprising further increasing the displacement of the two forcing pins relative to the two support pins such that a second crack forms at an interface between the first semiconductor die and the second substrate, and between the second semiconductor die and the second substrate.

20. The method of claim 19, further comprising:
  further increasing the displacement of the two forcing pins relative to the two support pins such that the second crack propagates relative to the interface,
  wherein determining the force vs. displacement profile of the interfacial bonding test structure further comprises determining an approximately constant force vs. displacement portion of the displacement profile corresponding to propagation of the second crack, and
  wherein determining the interfacial bonding energy further comprises determining the interfacial bonding energy based on a value of the approximately constant force vs. displacement portion of the force vs. displacement profile.

\* \* \* \* \*